(12) United States Patent
Fujisawa

(10) Patent No.: US 9,006,871 B2
(45) Date of Patent: Apr. 14, 2015

(54) SEMICONDUCTOR DEVICE AND METHOD OF MANUFACTURING THE SAME

(75) Inventor: Atsushi Fujisawa, Nanae (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/639,509

(22) PCT Filed: May 12, 2010

(86) PCT No.: PCT/JP2010/058023
§ 371 (c)(1),
(2), (4) Date: Oct. 4, 2012

(87) PCT Pub. No.: WO2011/142006
PCT Pub. Date: Nov. 17, 2011

(65) Prior Publication Data
US 2013/0020692 A1 Jan. 24, 2013

(51) Int. Cl.
*H01L 23/495* (2006.01)
*H01L 23/00* (2006.01)
*H01L 23/31* (2006.01)

(52) U.S. Cl.
CPC .... *H01L 23/49503* (2013.01); *H01L 23/49513* (2013.01); *H01L 23/49575* (2013.01); *H01L 23/49582* (2013.01); *H01L 24/32* (2013.01); *H01L 24/97* (2013.01); *H01L 23/562* (2013.01); *H01L 23/3107* (2013.01); *H01L 2224/27013* (2013.01); *H01L 2224/32057* (2013.01); *H01L 2224/32245* (2013.01); *H01L 2224/48091* (2013.01); *H01L 2224/48247* (2013.01); *H01L 2224/49171* (2013.01); *H01L 2224/73265* (2013.01); *H01L 2224/83051* (2013.01);

(Continued)

(58) Field of Classification Search
CPC .............................. H01L 23/495; H01L 21/56
USPC .................. 257/676, 666, 670, 671, 673, 661
See application file for complete search history.

(56) References Cited

U.S. PATENT DOCUMENTS

2009/0317948 A1* 12/2009 Nakamura et al. ............ 438/123
2010/0244214 A1* 9/2010 Arita et al. ..................... 257/676
2011/0097854 A1* 4/2011 Fujishima et al. ............. 438/123

FOREIGN PATENT DOCUMENTS

JP 63-310151 A 12/1988
JP 2001-127232 * 5/2001

(Continued)

OTHER PUBLICATIONS

Japanese Patent Office, Notification of Reasons for Refusal, Application No. 2012-514635, mailed Apr. 1, 2014.

*Primary Examiner* — Chuong A Luu
(74) *Attorney, Agent, or Firm* — Miles & Stockbridge P.C.

(57) ABSTRACT

A trench portion (trench) is formed at each of four corner portions of a chip bonding region having a quadrangular planar shape smaller than an outer-shape size of a die pad included in a semiconductor device. Each trench is formed along a direction of intersecting with a diagonal line which connects between the corner portions where the trench portions are arranged, and both ends of each trench portion are extended to an outside of the chip bonding region. The semiconductor chip is mounted on the chip bonding region so as to interpose a die-bond material. In this manner, peel-off of the die-bond material in a reflow step upon mounting of the semiconductor device on a mounting substrate can be suppressed. Also, even if the peel-off occurs, expansion of the peel-off can be suppressed.

13 Claims, 30 Drawing Sheets

(52) U.S. Cl.
CPC ............ *H01L2224/83385* (2013.01); *H01L 2224/85439* (2013.01); *H01L 2224/85444* (2013.01); *H01L 2924/01004* (2013.01); *H01L 2924/01013* (2013.01); *H01L 2924/01029* (2013.01); *H01L 2924/01032* (2013.01); *H01L 2924/01047* (2013.01); *H01L 2924/0105* (2013.01); *H01L 2924/01078* (2013.01); *H01L 2924/01079* (2013.01); *H01L 2924/01082* (2013.01); *H01L 2924/01005* (2013.01); *H01L 2924/01006* (2013.01); *H01L 2924/01019* (2013.01); *H01L 2924/01033* (2013.01); *H01L 2924/014* (2013.01); *H01L 24/48* (2013.01); *H01L 24/49* (2013.01); *H01L 2924/0132* (2013.01); *H01L 2924/0133* (2013.01); *H01L 2224/29111* (2013.01); *H01L 2224/2919* (2013.01); *H01L 2223/54486* (2013.01); *H01L 2924/15747* (2013.01); *H01L 2924/12041* (2013.01); *H01L 2224/97* (2013.01)

(56) References Cited

FOREIGN PATENT DOCUMENTS

| | | | |
|---|---|---|---|
| JP | 2001-127232 | A | 5/2001 |
| JP | 2007-134394 | A | 5/2007 |
| JP | 2009-071154 | A | 4/2009 |

\* cited by examiner

SEMICONDUCTOR DEVICE AND METHOD OF MANUFACTURING THE SAME

TECHNICAL FIELD

The present invention relates to a semiconductor device and a technique of manufacturing the same, and, more particularly, the present invention relates to a technique effectively applied to a semiconductor device including a semiconductor chip bonded on a chip bonding portion whose outer-shape size is larger than the semiconductor chip.

BACKGROUND ART

FIG. 2 of Japanese Patent Application Laid-Open Publication No. 2009-71154 (Patent Document 1) illustrates a semiconductor device including a semiconductor chip bonded on a chip bonding portion exposed from a sealing body. Also, in Patent Document 1, an outer-shape size of the chip bonding portion is larger than an outer-shape size of the semiconductor chip.

Further, FIG. 8A of Japanese Patent Application Laid-Open No. 2007-134394 (Patent Document 2) illustrates a semiconductor device including a semiconductor chip bonded on a chip bonding portion having a trench formed on an upper surface (front surface) thereof.

PRIOR ART DOCUMENTS

Patent Documents

Patent Document 1: Japanese Patent Application Laid-Open Publication No. 2009-71154
Patent Document 2: Japanese Patent Application Laid-Open Publication No. 2007-134394

DISCLOSURE OF THE INVENTION

Problems to be Solved by the Invention

Along with increase in a speed (or functionality) of an electronic device, an amount of heat generation of a mounted semiconductor device tends to increase. Accordingly, the inventor of the present application has studied a structure such that a chip bonding portion (die pad, tab) on which a semiconductor chip is bonded is exposed from a sealing body as illustrated in FIG. 2 of the above-described Patent Document 1. In such a structure, a lower surface (rear surface) of the chip bonding portion can be also connected to a mounting substrate, and therefore, heat dissipation performance can be improved, compared with a structure that the chip bonding portion is covered with the sealing body. Also, by forming the outer-shape size of the chip bonding portion larger than the outer-shape size of the semiconductor chip as illustrated in FIG. 2 of the above-described Patent Document 1, the heat dissipation performance can be further improved.

However, when the outer-shape size of the chip bonding portion is simply formed large, the semiconductor chip fixed to the chip bonding portion is easily peeled off therefrom. This is because a base material (lead frame) forming the chip bonding portion is different from a material forming the semiconductor chip. That is, this is because there is a difference between their linear expansion coefficients. Therefore, when heat is applied to such a semiconductor device, stress occurs in a die-bond material (adhesive material) used for fixing the semiconductor chip to the chip bonding portion since an expansion/shrink amount of the base material is different from an expansion/shrink amount of the semiconductor chip.

Also, if each planar shape of the used semiconductor chip and chip bonding portion is quadrangular, this peel-off problem easily occurs particularly at corner portions of the chip bonding portion (corner portions of the semiconductor chip). This is because the stress is the largest at the corner portions which are far from a center portion thereof. And, if the peel-off of the die-bond material due to the stress occurs at the corner portions of the chip bonding portion, the peel-off is expanded toward the center portion of the chip bonding portion, and, as a result, the die-bond material is peeled off in a wide range, which is a cause of reduction in reliability.

Further, in the case of the structure that a part (the lower surface) of the chip bonding portion is exposed from the sealing body as illustrated in FIG. 2 of the above-described Patent Document 1, it is difficult to completely seal a space between the chip bonding portion and the sealing body. Therefore, compared with the structure that the chip bonding portion is covered with the sealing body, moisture easily enters inside the semiconductor device.

As described above, in the case of the structure that the outer-shape size of the chip bonding portion is larger than the outer-shape size of the semiconductor chip and that the part (lower surface) of the chip bonding portion is exposed from the sealing body, the structure is a cause of reducing the reliability of the semiconductor device in a long-term viewpoint.

Accordingly, as a structure that the peel-off of the die-bond material can be suppressed even if the moisture enters, the inventor of the present application has studied about, for example, formation of a trench as illustrated in FIG. 8A of the above-described Patent Document 2 on an upper surface (front surface) of the chip bonding portion.

However, it has been found out that the stress at the corner portions of the chip bonding portion cannot be sufficiently reduced by, for example, the trench as illustrated in FIG. 8A of the above-described Patent Document 2. Moreover, it has been found out that, when the peel-off occurs at the corner portions, the peel-off progresses toward the center portion of the chip bonding portion through a region where the trench is not formed, and therefore, the die-bond material is peeled off in a wide range as a result.

The present invention has been made in consideration of the above-described problems, and a preferred aim thereof is to provide a technique capable of suppressing the reduction in reliability of a semiconductor device.

Also, another preferred aim of the present invention is to provide a technique capable of improving heat dissipation performance of the semiconductor device.

The above and other preferred aims and novel characteristics of the present invention will be apparent from the description of the present specification and the accompanying drawings.

Means for Solving the Problems

The typical ones of the inventions disclosed in the present application will be briefly described as follows.

That is, in a semiconductor device which is an aspect of the invention of the present application, a planar shape of a chip bonding region of a die pad on which a semiconductor chip is mounted is a quadrangular shape smaller than an outer-shape size of the die pad. And, in the chip bonding region, a first trench (groove) is formed at a first corner portion of the chip bonding region, a second trench is formed at a second corner portion opposed to the first corner portion so as to interpose a center portion of the chip bonding region therebetween, a third trench is formed at a third corner portion positioned between the first corner portion and the second corner portion, and a fourth trench is formed at a fourth corner portion opposed to the third corner portion so as to interpose the center portion of the chip bonding region therebetween. And, the semiconductor chip is mounted on the chip bonding region so as to interpose a die-bond material therebetween.

Also, in plan view, each of the first trench and the second trench is formed along a first direction intersecting with a first diagonal line connecting between the first corner portion and the second corner portion of the chip bonding region. Moreover, in the plan view, each of the third trench and the fourth trench is formed along a second direction intersecting with a second diagonal line of the chip bonding region intersecting with the first diagonal line. Further, in the plan view, each of the first trench, the second trench, the third trench, and the fourth trench is formed from a region overlapped with the semiconductor chip to a region not overlapped with the semiconductor chip.

Effects of the Invention

Effects obtained by typical aspects of the invention disclosed in the present application will be briefly described below.

That is, reduction in reliability of a semiconductor device can be suppressed.

BRIEF DESCRIPTIONS OF THE DRAWINGS

BEST MODE FOR CARRYING OUT THE INVENTION

Figure 1:
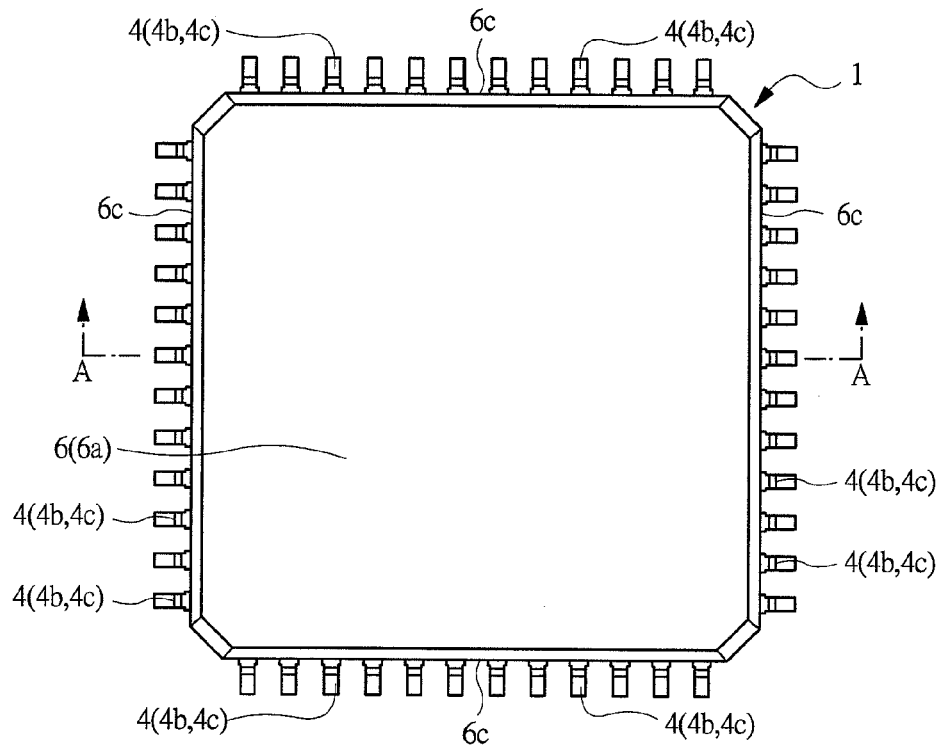
FIG. 1 is a top view of a semiconductor device according to an embodiment of the present invention.

In the present application, the embodiments are described in a plurality of sections or others when required as a matter of convenience. However, these sections or others are not independent from each other unless otherwise stated, and the one in each portion of single example relates to the entire, a part, or a partial detail of the other as a modification example or others regardless of the described context. Also, in principle, the repetitive description of the similar portions is omitted. Further, the number of each element in the embodiments is not always limited to a specific number unless otherwise stated or except the case where the number is logically limited to the specific number or except the case where the number is apparently not the specific number from the context.

Similarly, in the description of the embodiments or others, when "X formed of A" is described for a material, composition, or others, the one containing other components than A is not eliminated unless otherwise stated or except the case where it is apparently not so. For example, when a component is described, it means such as "X containing A as a principal component". For example, even when a "silicon member" or others is described, it goes without saying that it includes not only pure silicon but also SiGe (silicon germanium) alloy, multi metal alloy containing other silicon as the principal component, and a member containing other additives or others. In addition, even when gold plating, Cu layer, nickel plating, and others are described, they include not only pure materials but also a member containing gold, Cu, nickel, and others as the principal component, respectively, unless otherwise stated or except the case where they are apparently not so.

Still further, even when referring to the specified number or amount, the number may be larger or smaller than the specified number unless otherwise stated, except the case where the number is logically limited to the specified number, or except the case where it is apparently not so from the context.

Moreover, the same or similar components are denoted by the same or similar reference symbols or reference numbers throughout each drawing of the embodiments, and the repetitive description thereof will be omitted in principle.

In addition, in accompanying drawings, hatching or others may be omitted even in a cross section in the case that the drawing is adversely complicated or the case that a portion is distinct from an empty space. Regarding this, an outline of background is omitted even in a closed hole in plan view in some cases such that it is clear from explanations or others. Further, even not in the cross-sectional surface, hatching may be added in order to clarify that it is not the empty space.

First Embodiment

Figure 2:
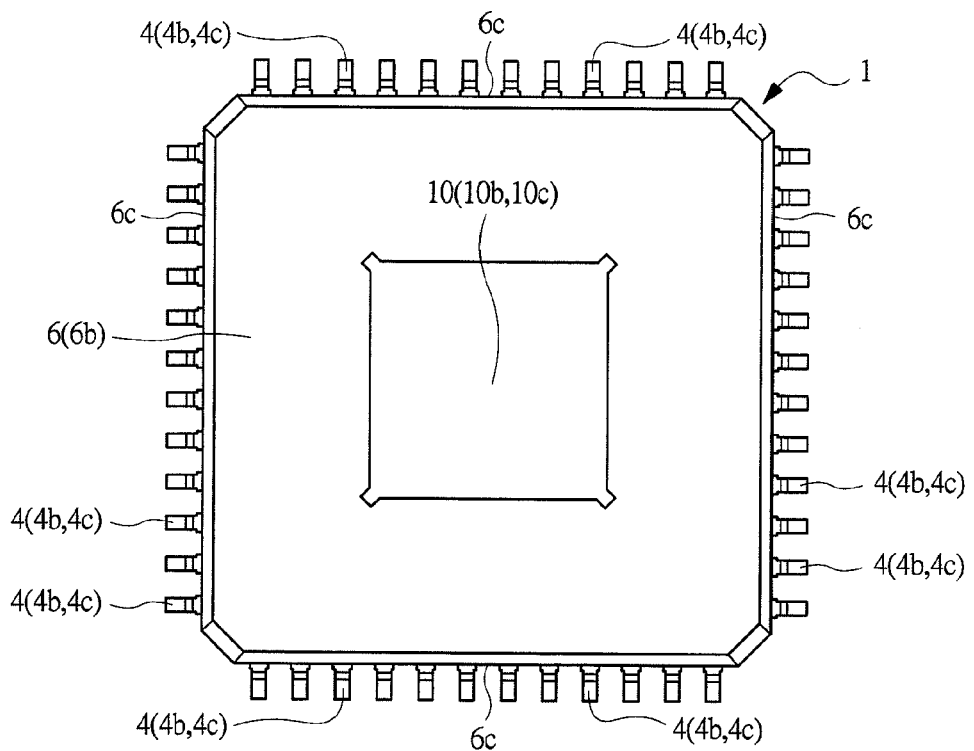
FIG. 2 is a bottom view of the semiconductor device illustrated in FIG. 1.
Figure 3:
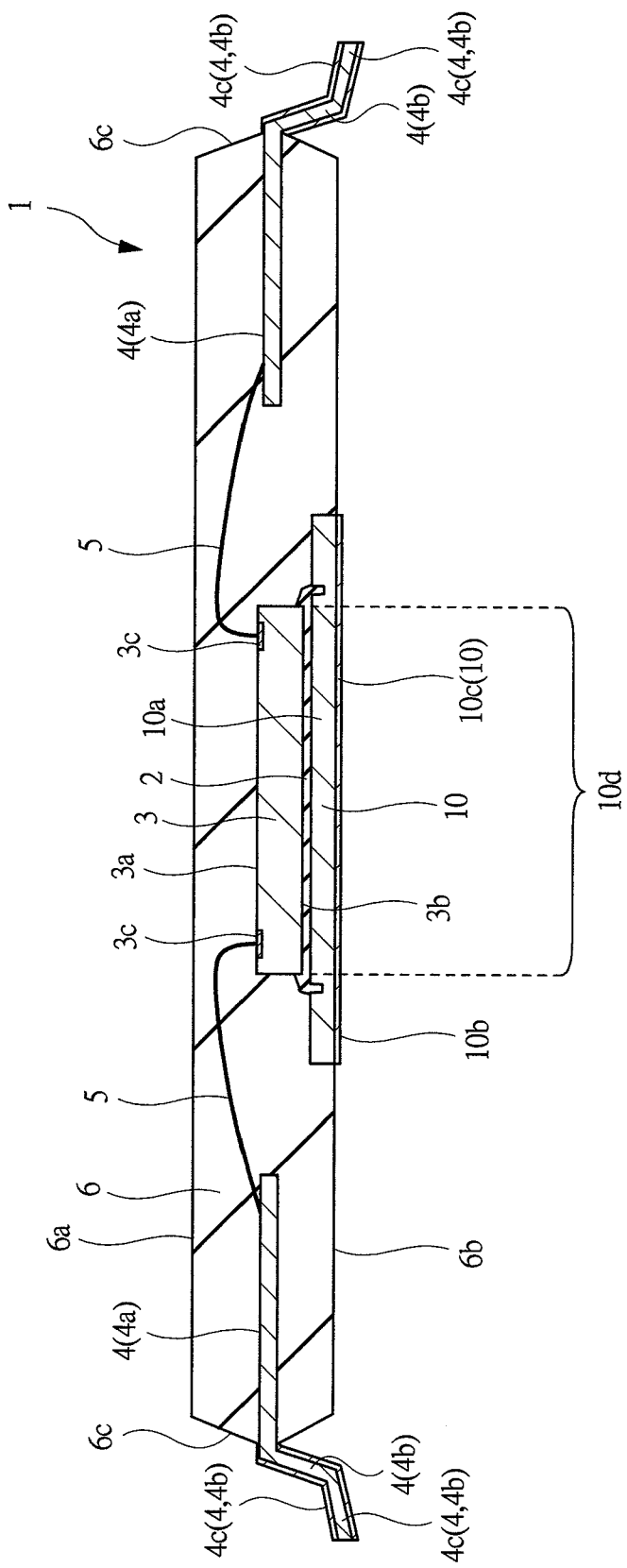
FIG. 3 is a cross-sectional view taken along a line A-A of FIG. 1.
Figure 4:
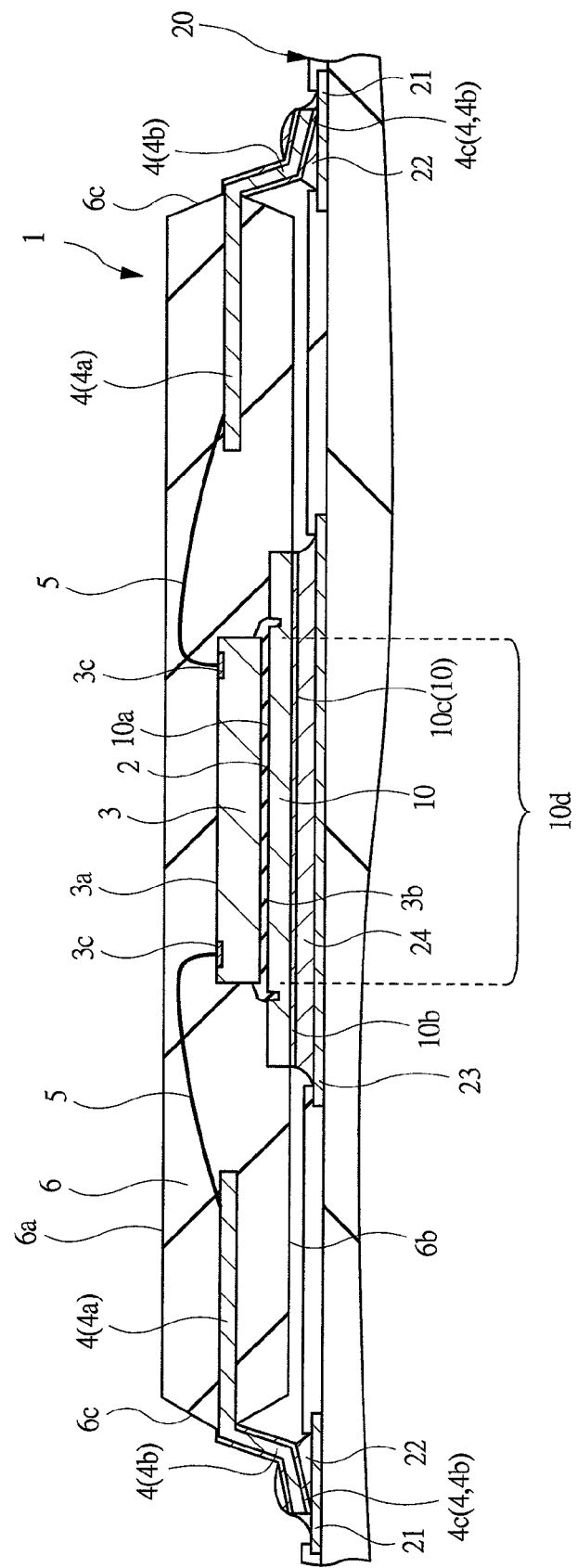
FIG. 4 is an enlarged cross-sectional view illustrating a package-mounted structure that the semiconductor device illustrated in FIG. 3 is mounted on a mounting substrate.
Figure 5:
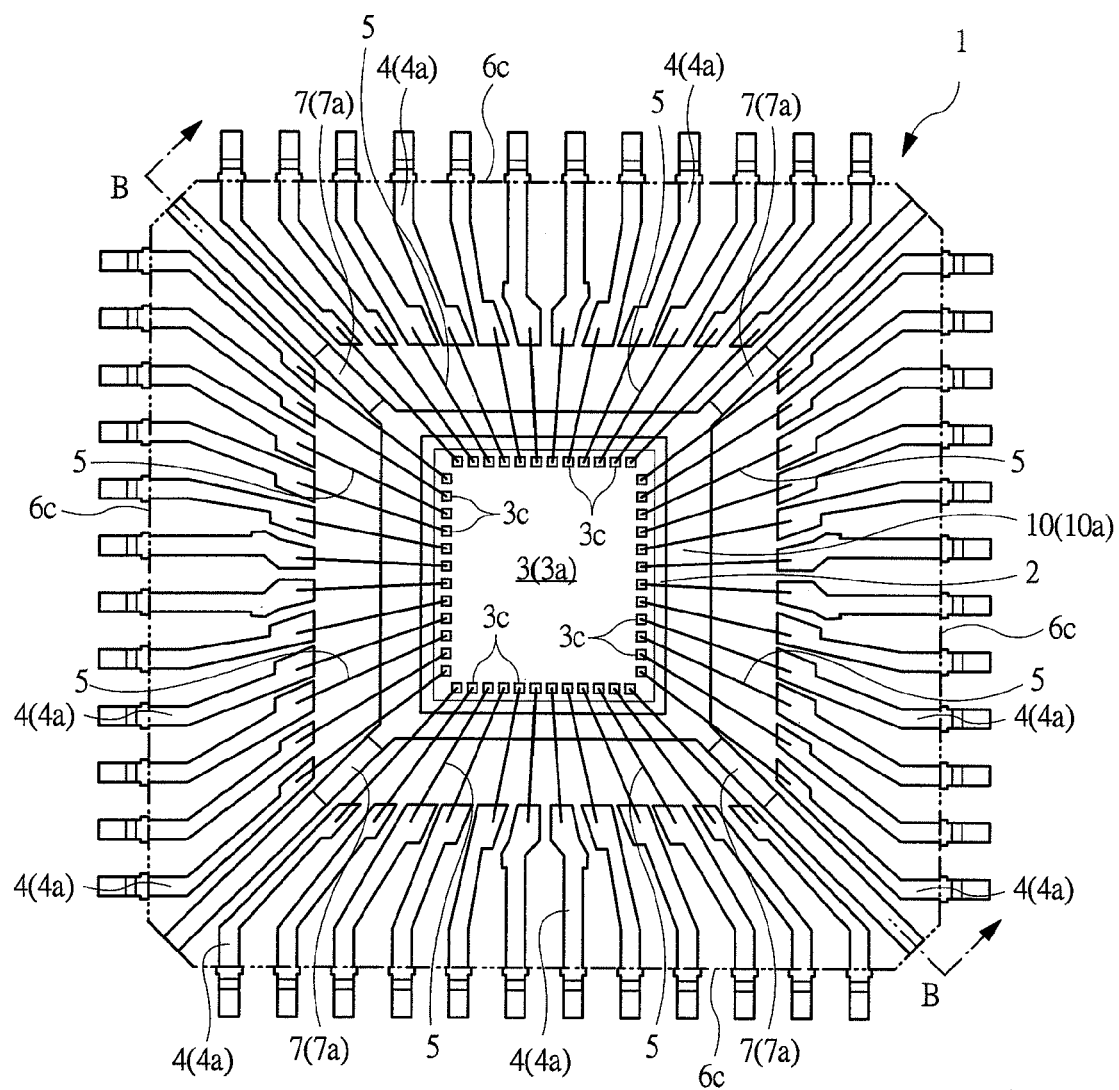
FIG. 5 is a plan view illustrating an internal structure of the semiconductor device in a state that a sealing resin illustrated in FIG. 1 is removed.
Figure 6:
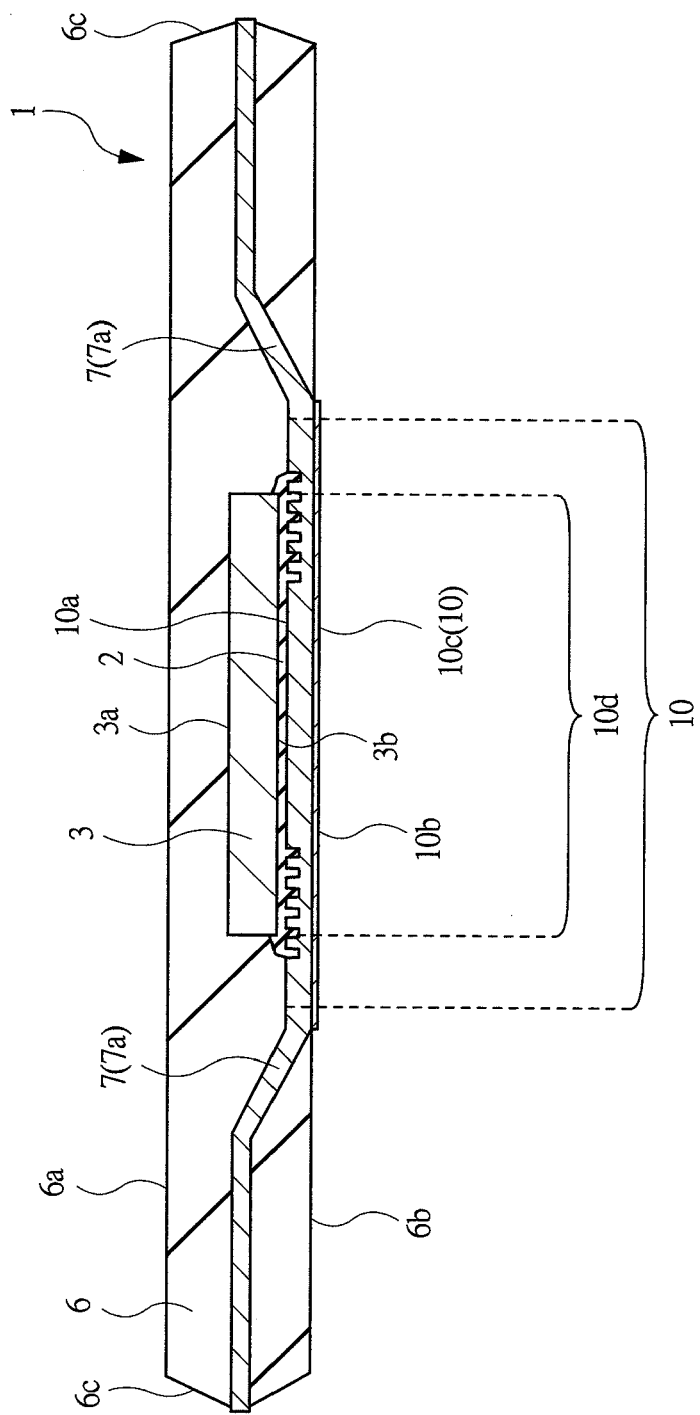
FIG. 6 is a cross-sectional view taken along a line B-B of FIG. 5.

In the present embodiment, a semiconductor device of a QFP (Quad Flat Package) type will be taken as an example of a semiconductor device and explained. FIG. 1 is a top view of the semiconductor device of the present embodiment, FIG. 2 is a bottom view of the semiconductor device illustrated in FIG. 1, and FIG. 3 is a cross-sectional view taken along a line A-A of FIG. 1. Also, FIG. 4 is an enlarged cross-sectional view illustrating a package-mounted structure that the semiconductor device illustrated in FIG. 3 is mounted on a mounting substrate. Further, FIG. 5 is a plan view illustrating an internal structure of the semiconductor device in a state that a sealing resin illustrated in FIG. 1 is removed, and FIG. 6 is a cross-sectional view taken along a line B-B of FIG. 5.

<Semiconductor Device>

First, a configuration of a semiconductor device 1 of the present embodiment will be explained with reference to FIGS. 1 to 4. As illustrated in FIG. 3, the semiconductor device 1 of the present embodiment is provided with: a die pad 10; a semiconductor chip 3 mounted on the die pad 10 via a die-bond material 2; a plurality of leads 4 arranged in a periphery of the semiconductor chip 3; a plurality of wires 5 for electrically connecting a plurality of electrode pads 3c of the semiconductor chip 3 and the plurality of leads 4; and a sealing resin 6 for sealing the semiconductor chip 3, the plurality of wires 5, and the die pad 10.

A planar shape of the sealing resin (sealing body) 6 is rectangular, and is quadrangular in the present embodiment as illustrated in FIG. 1. More specifically, each of corner portions thereof is chamfered, so that crack of the sealing body is suppressed. Also, as illustrated in FIG. 2, the sealing resin 6 has: an upper surface 6a; a lower surface (rear surface, mounting surface) 6b on an opposite side to this upper surface 6a; and lateral surfaces 6c positioned between the upper surface 6a and the lower surface 6b.

As illustrated in FIG. 1, the plurality of leads 4 are exposed from the respective lateral surfaces (sides) 6c of the sealing resin 6. More specifically, as illustrated in FIG. 3, a part (outer lead 4b) of each of the plurality of leads 4 formed along the sides of the sealing resin 6 is extended from the lateral surface (side) 6c of the sealing resin 6 toward an outside, and besides, is bent outside the sealing resin 6 toward the lower surface 6b side of the sealing resin 6. In other words, a plurality of outer leads 4b are extended out from each side of the sealing resin 6, and each of the outer leads is formed in a gull wing shape. A semiconductor device provided with such a package form is called a QFP-type semiconductor device. The plurality of leads 4 are external connection terminals (external terminals) used when the semiconductor device 1 is to be mounted on a mounting substrate 20 illustrated in FIG. 4, and are to be electrically connected to a plurality of lands (terminals) 21 formed on the mounting surface of the mounting substrate 20 via a joint material such as a solder material 22. Therefore, as illustrated in FIGS. 1 to 3, an exterior plating film 4c made of, for example, solder is formed on each surface of the plurality of leads 4 (more specifically, the outer leads 4b) in order to improve connectivity (wettability) between each of the leads 4 and the solder material (joint material) 22 (see FIG. 4) upon the mounting.

Also, as illustrated in FIG. 2, in the lower surface 6b of the sealing resin 6, a lower surface 10b of the die pad (chip bonding portion, tab) 10 is exposed from the sealing resin 6. That is, the semiconductor device 1 is a semiconductor device of a die-pad exposing type (tab exposing type). Also, the die pad 10 is made of a metal material having a higher thermal conductivity than that of the sealing resin 6, and is made of, for example, copper (Cu) in the present embodiment. More specifically, a plating film (whose illustration is omitted) made of, for example, nickel (Ni) is formed on a surface of a base material made of copper (Cu). In this manner, in the semiconductor device of the die-pad exposing type, heat dissipation performance of the package can be improved by exposing the member (die pad 10) made of the metal material such as copper (Cu) having the higher thermal conductivity than that of the sealing resin 6, compared with a semiconductor device in which the die pad 10 is not exposed. Moreover, when the semiconductor device 1 is mounted on the mounting substrate 20 illustrated in FIG. 4, if the lower surface 10b of the die pad 10 is connected to a terminal 23 of the mounting substrate 20 via, for example, a solder material (joint material) 24, heat generated in the semiconductor device 1 can be further efficiently dissipated toward the mounting substrate 20 side. Note that, while the terminal 23 and the semiconductor chip 3 illustrated in FIG. 4 can be heat-dissipating terminals which are not electrically connected, the terminal can be also used as, for example, a terminal electrically connected to the lower surface 3b of the semiconductor chip 3 for supplying a power-supply potential or a reference potential to the semiconductor chip 3. Also, as illustrated in FIG. 4, when the terminal 23 of the mounting substrate 20 is connected to the lower surface 10b of the die pad 10, it is preferred to form an exterior plating film 10c made of, for example, solder on the lower surface 10b of the die pad 10 as illustrated in FIG. 3 in order to improve the connectivity (wettability) between the lower surface 10b of the die pad 10 and the solder material (joint material) 24.

Next, the internal structure of the semiconductor device 1 will be explained. As illustrated in FIG. 5, the planar shape of the upper surface (chip bonding surface) 10a of the die pad 10 is quadrangular. And, a chip bonding region 10d (see FIGS. 3 and 6) whose planar shape is quadrangular is provided on the upper surface of the die pad 10.

Note that in the present embodiment, the die pad 10 which is the member for bonding the semiconductor chip 3 thereon and the chip bonding region 10d (see FIGS. 3 and 6) which is provided on the upper surface of the die pad 10 and which is a region for bonding the semiconductor chip 3 thereon are differentiated from each other for explanation. That is, the die pad 10 is a chip bonding member for bonding the semiconductor chip 3 on at least a part of the die pad, and a planar size thereof does not always match, for example, a planar size of the upper surface (main surface) 3a (or the lower surface (main surface) 3b illustrated in FIGS. 3 and 6) of the semiconductor chip 3 as illustrated in FIG. 5. On the other hand, the chip bonding region 10d illustrated in FIGS. 3 and 6 is indicated as a region of the upper surface 10a of the die pad 10 which is overlapped with the semiconductor chip 3 in plan view. Therefore, in the semiconductor device 1 of the present embodiment in which an outer-shape size (planar size) of the die pad 10 is larger than an outer-shape size (planar size) of the semiconductor chip 3, the planar size of the upper surface (main surface, first main surface) 3a (or lower surface (main surface, second main surface) 3b) of the semiconductor chip 3 matches the planar size of the chip bonding region 10d. For example, in the present embodiment, the outer-shape size of the die pad 10 is about 7 mm×7 mm. On the other hand, the outer-shape size of the semiconductor chip 3, that is, the outer-shape size of the chip bonding region 10d is about 5 mm×5 mm.

Also, it is set that a thickness of the semiconductor chip is, for example, 280 µm, that a thickness of the die pad 10 is 150 µm, and that a thickness of the die-bond material 2 (which is a distance between the lower surface 3b and the upper surface 10a) is about 10 µm to 20 µm. Note that FIGS. 3, 4, and 6 illustrate a state that an aspect ratio of each member is changed so that the member is narrower in a width direction than that with the above-described numerical values in order to easily see the entire structure of the semiconductor device. Also, the die bond material 2 is very thin as about 10 µm to 20 µm, and therefore, in FIGS. 3, 4, and 6 illustrating the entire structure of the semiconductor device 1, the die bond material is illustrated to be thicker than the above-described numerical value. Note that the thickness of the die-bond material 2 is illustrated as a thickness corresponding to the above-described numerical value in a partial enlarged view (for example, FIG. 8) described later. Other detailed structures of the die pad 10 will be described later.

The semiconductor chip 3 is mounted on the chip bonding region 10d of the die pad 10. In the present embodiment, the semiconductor chip 3 is mounted at the center of the die pad. The semiconductor chip 3 is mounted on the chip bonding region 10d via the die-bond material (adhesive material) 2 in a state that the lower surface 3b is opposed to the upper surface of the die pad 10. That is, the semiconductor chip is mounted in a so-called face-up mounting method in which an opposite surface to the upper surface (main surface) 3a on which the plurality of electrode pads 3c are formed is opposed to the chip bonding surface. This die-bond material 2 is an adhesive material used when the semiconductor chip 3 is die-bonded, and the die-bond material 2 made of, for example, an epoxy-based thermoset resin containing metal particles made of silver (Ag) or others is used in the present embodiment. This thermoset resin contained in the die-bond material 2 is preferred in a point that the resin has a paste-like property before the thermal hardening so that it can be sufficiently buried between the chip bonding region 10d and the semiconductor chip 3. Also, the containing of the metal particles in the die-bond material 2 is preferred in a point that the heat transfer efficiency of a heat transfer path (heat dissipation path) from the lower surface 3b of the semiconductor chip 3 toward the die pad 10 can be improved. Further, the containing of the metal particles in the die bond material 2 can electrically connect between the die pad 10 and the lower surface 3b of the semiconductor chip 3, and therefore, for example, the lower surface 3b of the semiconductor chip 3 can be also used as an electrode as a modification example of the present embodiment.

As illustrated in FIG. 5, the planar shape of the semiconductor chip 3 mounted on the die pad 10 is quadrangular. Also, as illustrated in FIGS. 3 and 6, the semiconductor chip 3 has the upper surface (main surface, front surface) 3a, the lower surface (main surface, rear surface) 3b on the side opposite to the upper surface 3a, and lateral surfaces positioned between the upper surface 3a and the lower surface 3b.

And, as illustrated in FIGS. 3 and 5, the plurality of electrode pads (bonding pads) 3c are formed on the upper surface 3a of the semiconductor chip 3, and the plurality of electrode pads 3c are formed along each of the sides of the upper surface 3a in the present embodiment. And, semiconductor elements (circuit elements) whose illustration is omitted are formed on the main surface of the semiconductor chip 3 (more specifically, a semiconductor element formation region provided on the upper surface of the base material of the semiconductor chip 3), and the plurality of electrode pads 3c are electrically connected to the semiconductor elements via wiring (whose illustration is omitted) formed in a wiring layer arranged inside the semiconductor chip 3 (more specifically, between the upper surface 3a and the semiconductor element formation region not illustrated).

The semiconductor chip 3 (more specifically, the base material of the semiconductor chip 3) is made of, for example, silicon (Si). Therefore, the semiconductor chip 3 and the die pad 10 have linear expansion coefficients different from each other. More specifically, the linear expansion coefficient of the semiconductor chip 3 mainly made of silicon (Si) is lower than the linear expansion coefficient of the die pad 10 mainly made of a metal material such as copper (Cu). Also, an insulating film for covering the base material and the wiring of the semiconductor chip 3 is formed on the upper surface 3a, and each surface of the plurality of electrode pads 3c is exposed from the insulating film at an opening portion formed in this insulating film.

Further, each of the electrode pads 3c is made of metal, and is made of, for example, aluminum (Al) in the present embodiment. Note that, on each surface of the electrode pads 3c, for example, a gold (Au) film may be formed via a nickel (Ni) film as a plating film. In this manner, each surface of the electrode pads 3c is covered with the nickel film, and therefore, corrosion (contamination) of the electrode pads 3c can be suppressed.

Still further, as illustrated in FIG. 5, the plurality of leads 4 each made of, for example, copper (Cu) as the same as the die pad 10 are arranged in a periphery of the semiconductor chip 3 (more specifically, a periphery of the die pad 10). More specifically, a plating film (whose illustration is omitted) made of, for example, nickel (Ni) is formed on the surface of the base material made of copper (Cu). And, the plurality of electrode pads (bonding pads) 3c formed on the upper surface 3a of the semiconductor chip 3 are electrically connected to the plurality of leads 4 (other portions of the leads, inner leads 4a) positioned inside the sealing resin 6 via a plurality of wires (conductive members) 5, respectively. The wire 5 is made of, for example, gold (Au), and one part (such as one end) of the wire 5 is joined to the electrode pad 3c and the other part (such as the other end) thereof is joined to a bonding region of the inner lead 4a. Note that a plating film whose illustration is omitted is formed on a surface of the bonding region of the inner lead 4a (more specifically, a surface of the plating film made of nickel (Ni)). The plating film is made of, for example, silver (Ag) or gold (Au). By forming the plating film made of silver (Ag) or gold (Au) on the surface of the bonding region of the inner lead 4a, the joint strength with the wire 5 made of gold (Au) can be improved.

Incidentally, as illustrated in FIG. 3, the die pad 10 is arranged at a height different from those of the inner leads 4a (as an offset arrangement) in the present embodiment. More specifically, the die pad 10 is arranged at a position lower than those of the inner leads 4a (as a down-set arrangement). In the package as the present embodiment in which the leads 4 are formed in the gull wing shape, it is preferred that the leads 4 are extended from an intermediate position between the upper surface 6a and the lower surface 6b on the lateral surface 6c of the sealing resin 6. This is for firmly fixing the inner leads 4a with the sealing resin 6. On the other hand, in order to expose the die pad 10 from the sealing resin 6, it is required to arrange the die pad at a height different from that of the inner leads 4a. Therefore, in the present embodiment, the die pad 10 is arranged as the offset arrangement (down-set arrangement). A plurality of suspending leads 7 integrally formed with the die pad 10 are connected to the die pad 10. In the present embodiment, as illustrated in FIG. 5, the suspending leads 7 are connected to corner portions of the die pad 10, respectively. That is, total four suspending leads 7 are connected thereto. The suspending leads 7 are supporting members for supporting the die pad 10, which are coupled to a frame portion of a lead frame (base material obtained by integrally forming the die pad 10 and the leads) in a manufacturing step of the semiconductor device 1 described later. And, a tilted portion 7a is formed in each of the plurality of suspending leads 7. In this manner, by forming the tilted portion 7a in each of the suspending leads 7, the die pad 10 is arranged as the offset arrangement (down-set arrangement).

<Detailed Structure of Die Pad>

Figure 7:
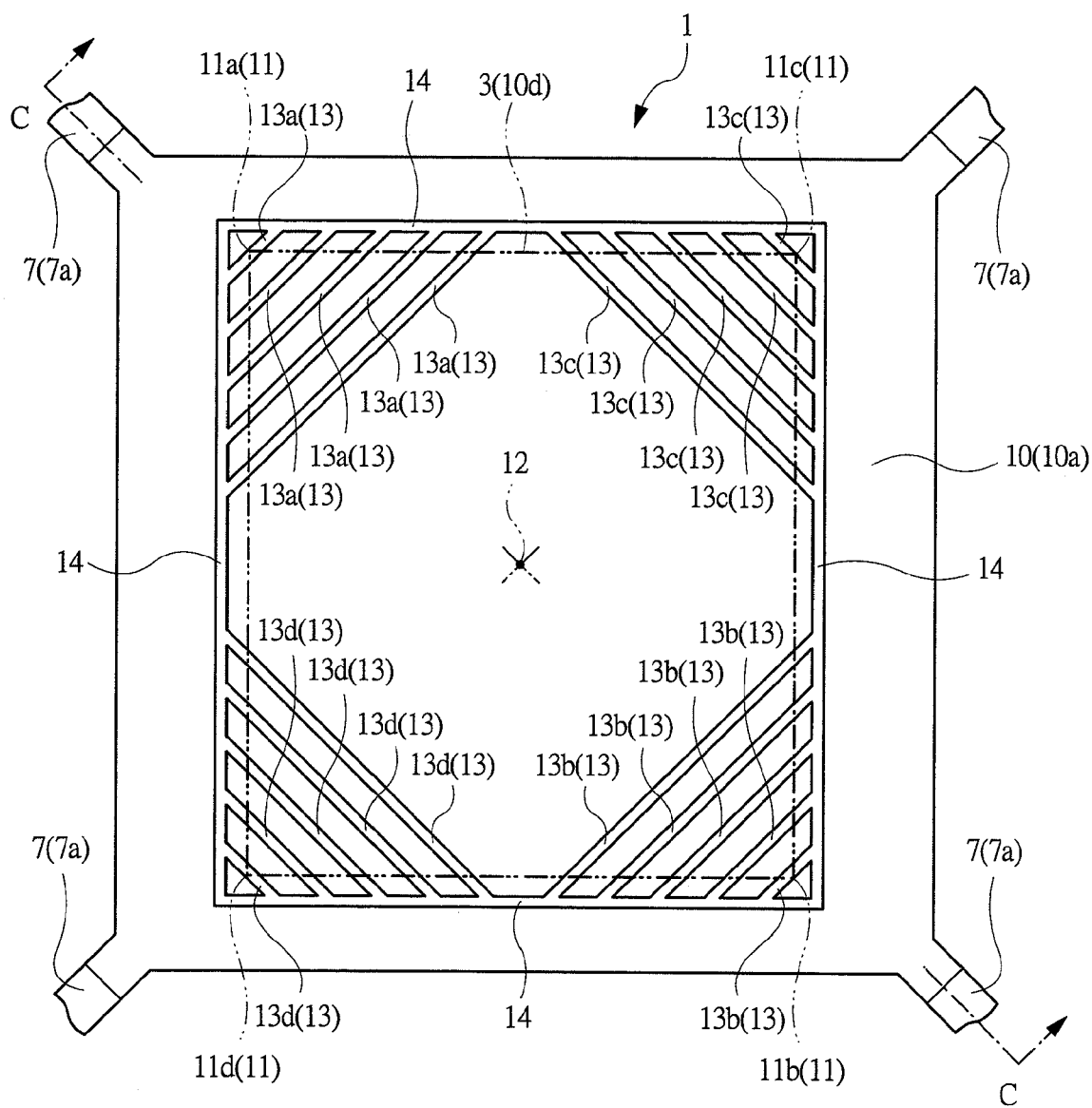
FIG. 7 is an enlarged cross-sectional view illustrating a die-pad peripheral portion illustrated in FIG. 5 so as to be enlarged.
Figure 8:
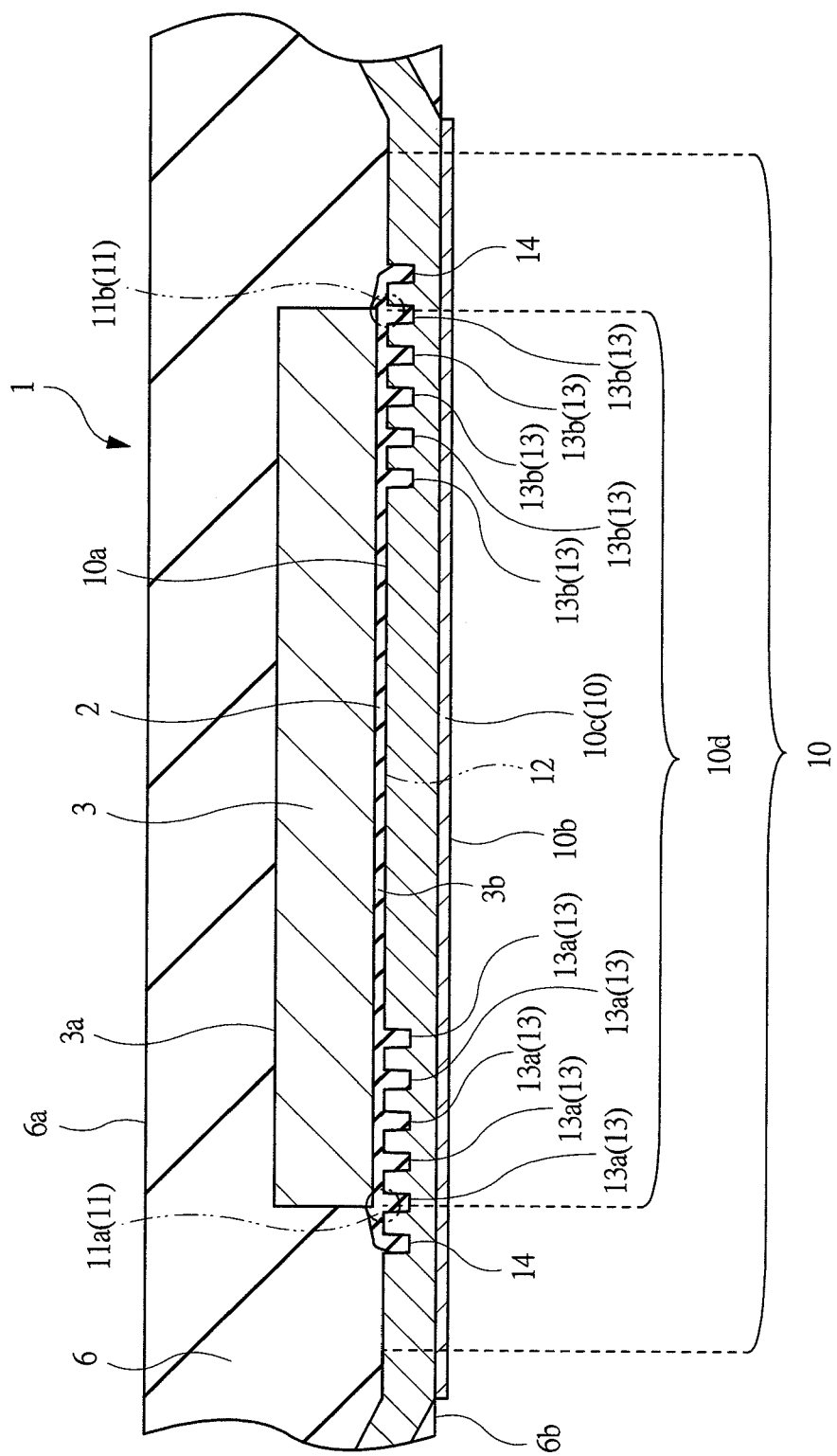
FIG. 8 is an enlarged cross-sectional view taken along a line C-C of FIG. 7.
Figure 28:
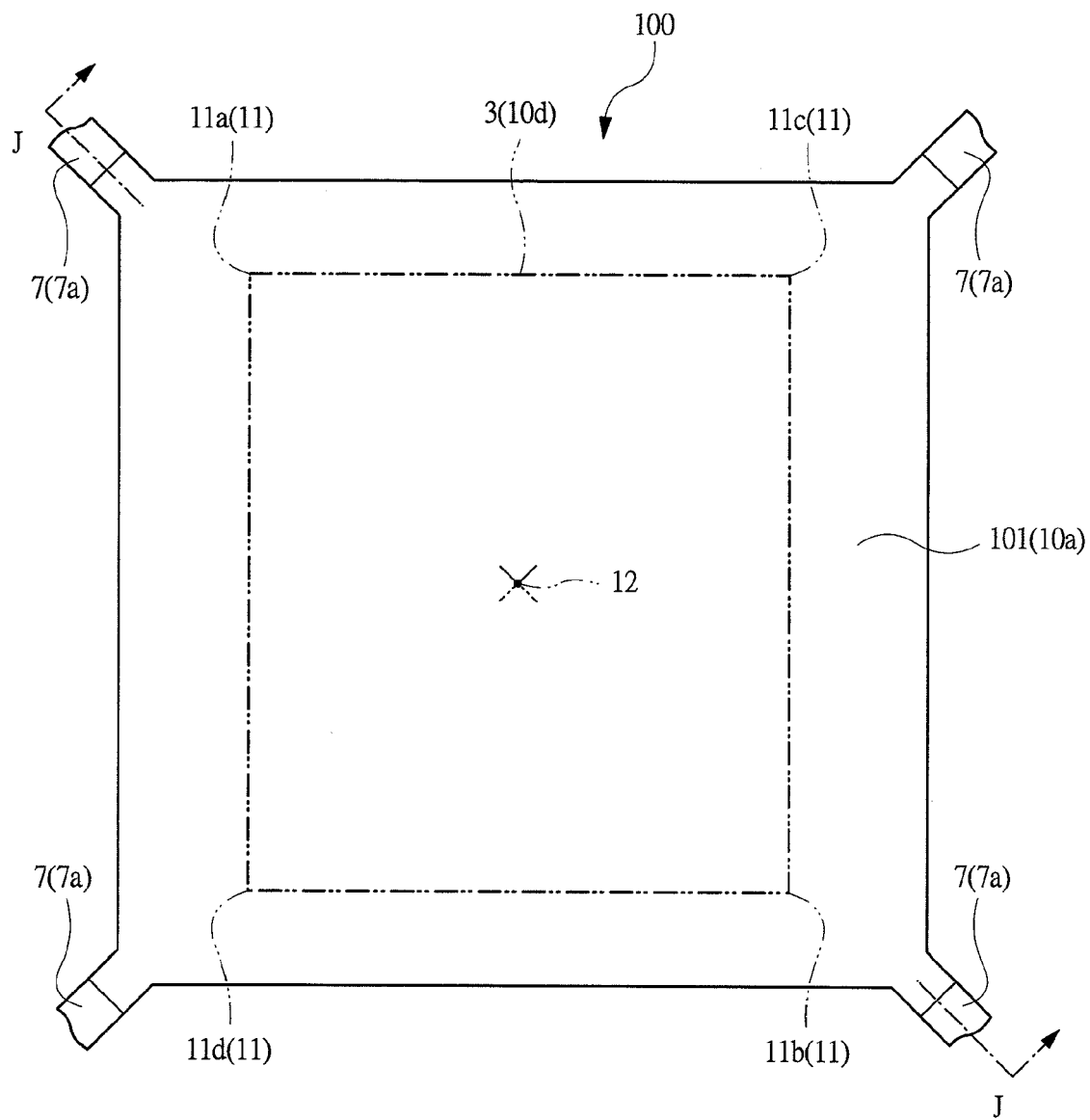
FIG. 28 is an enlarged plan view illustrating a first comparative example of a die pad illustrated in FIG. 8.
Figure 29:
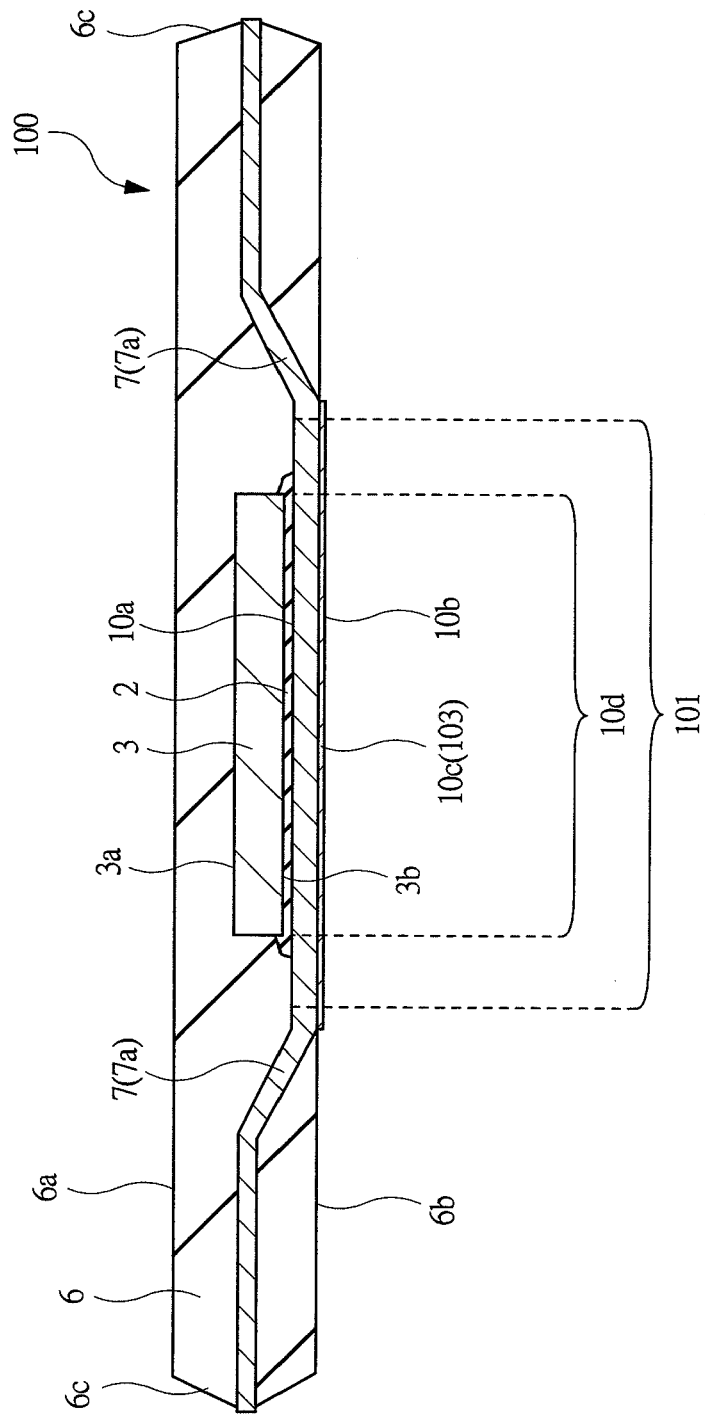
FIG. 29 is a cross-sectional view taken along a line J-J of FIG. 28.
Figure 30:
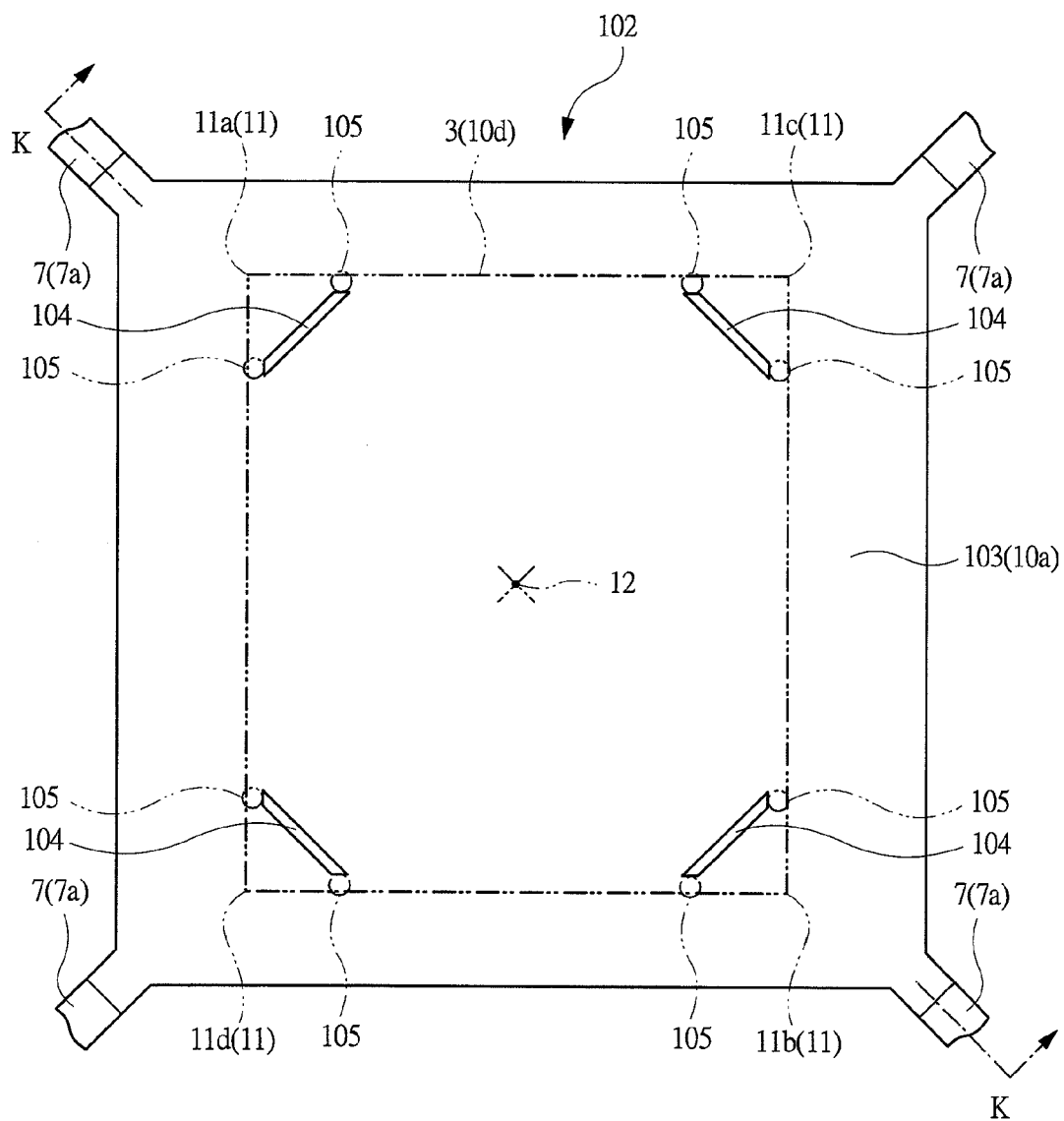
FIG. 30 is an enlarged plan view illustrating a second comparative example of a die pad illustrated in FIG. 8.
Figure 31:
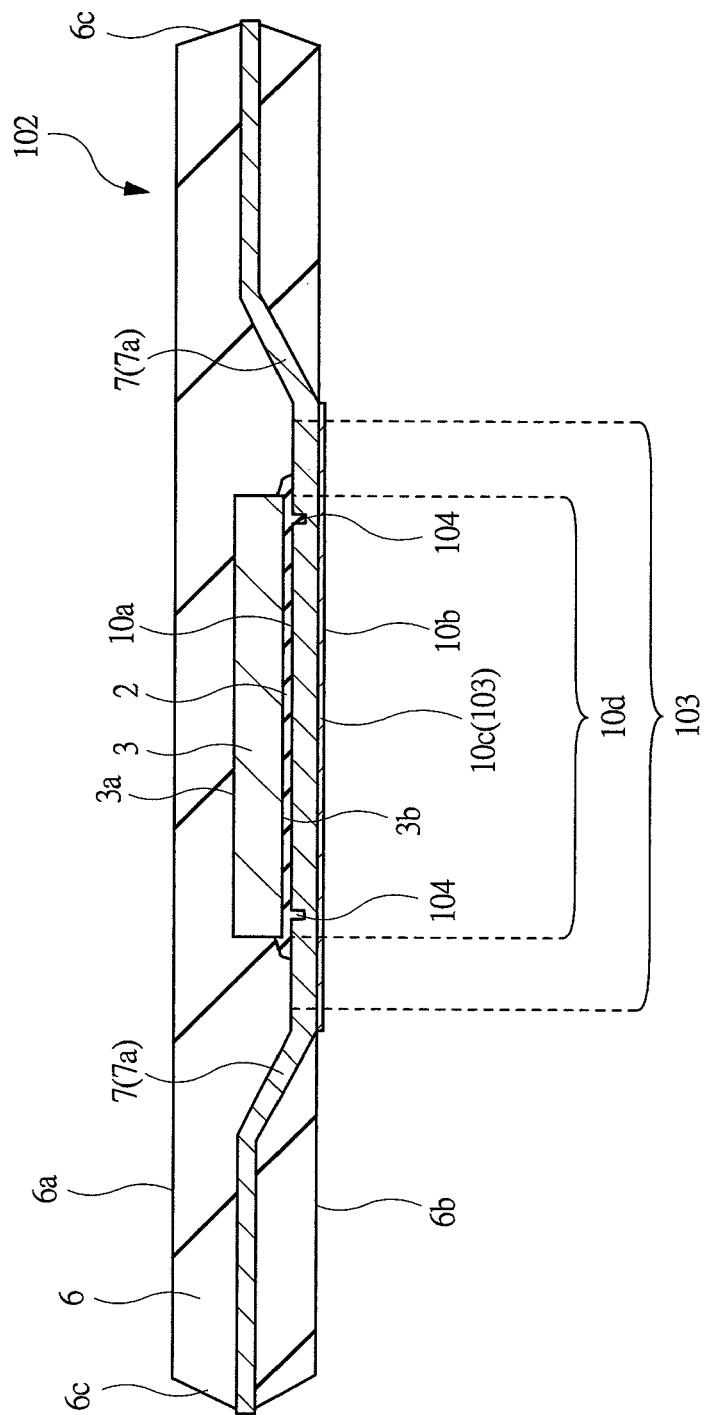
FIG. 31 is a cross-sectional view taken along a line K-K of FIG. 30.

Next, a detailed structure of the die pad 10 illustrated in FIG. 5 and effects obtained by employing the structure will be explained. FIG. 7 is an enlarged cross-sectional view illustrating a die-pad peripheral portion illustrated in FIG. 5 so as to be enlarged, and FIG. 8 is an enlarged cross-sectional view taken along a line C-C of FIG. 7. Also, FIG. 28 is an enlarged plan view illustrating a first comparative example of the die pad illustrated in FIG. 8, and FIG. 29 is a cross-sectional view taken along a line J-J of FIG. 28. Further, FIG. 30 is an enlarged plan view illustrating a second comparative example of the die pad illustrated in FIG. 8, and FIG. 31 is a cross-sectional view taken along a line K-K of FIG. 30. Note that FIG. 7 illustrates a state that the semiconductor chip and the die-bond material illustrated in FIG. 5 are eliminated in order to illustrate the planar arrangement of trenches (grooves) formed in the upper surface of the die pad.

A semiconductor device 100 illustrated in FIGS. 28 and 29 according to the first comparative example of the present embodiment has a structure similar to that of the semiconductor device 1 illustrated in FIGS. 7 and 8 except for a point that trenches are not formed in an upper surface 10a of a die pad 101. The semiconductor chip 3 and the die pad 101 in the semiconductor device 100 illustrated in FIGS. 28 and 29 have linear expansion coefficients different from each other (more specifically, the semiconductor chip 3 is mainly made of silicon (Si), and the die pad 101 is mainly made of copper (Cu)). Therefore, when thermal treatment is performed during a step of assembling the semiconductor device 100, stress occurs in the die bond material 2 which is used for fixing the semiconductor chip 3 to the die pad 101. More specifically, planar-direction stress (shearing stress) occurs at a bonding interface between the semiconductor chip 3 and the die-bond material 2 and a bonding interface between the die-bond material 2 and the die pad 101. And, this stress occurs in a region where the semiconductor chip 3 and the die pad 101 are overlapped with each other, and becomes the largest at the farthest positions distant from the center portion, that is, at each corner portion 11 of the chip bonding region 10d (semiconductor chip 3) having a quadrangular planar shape.

Even when the stress occurs as described above, if energy is not applied from outside to the semiconductor device 100, the peel-off at the bonding interface between the die-bond material 2 and the semiconductor chip 3 or the die pad 101 is difficult to occur. However, according to studies made by the inventor of the present application, it has been found out that the die-bond material 2 inside the semiconductor device 100 is peeled off from the semiconductor chip 3 or the die pad 101 when the semiconductor device 100 is heated in a reflow step (heating packaging step) of mounting the semiconductor device 100 whose assembly has been completed on a mounting substrate (such as the mounting substrate 20 illustrated in FIG. 4).

In the reflow step, the semiconductor device 100 is heated at a high temperature of, for example, 260° C. or higher. By heating the semiconductor device 100 at such a high temperature, moisture which is contained inside the semiconductor device 100 or enters from outside therein is rapidly expanded (exploded). And, the rapid expansion of the moisture triggers the peel-off of the die-bond material 2 from the semiconductor chip 3 or the die pad 101 in the region whose stress is the largest, that is, at each corner portion 11 of the chip bonding region 10d (semiconductor chip 3) having the quadrangular planar shape. And, the peel-off which has occurred at the corner portion 11 is expanded toward the center portion 12 of the chip bonding region 10d, so that the die-bond material 2 is peeled off in a wide range. Due to the peel-off of the die-bond material 2 from the semiconductor chip 3 or the die pad 101, a space is generated, and therefore, the moisture remains inside the space, which results in corrosion of the inside of the semiconductor device 100. That is, this is a cause of the reduction in reliability of the semiconductor device 100. Also, the generation of the space reduces the heat dissipation performance of the semiconductor device 100. The moisture that triggers the peel-off is contained inside, for example, the sealing resin 6. Further, in a semiconductor device in which the die pad 10 is exposed from the sealing resin 6 as the semiconductor device 100 or the semiconductor device 1 illustrated in FIG. 8, the moisture easily enters from outside therein.

As described above, in order to prevent or suppress the reduction in the reliability of the semiconductor device or the reduction in the heat dissipation performance thereof due to the peel-off of the die-bond material 2, the inventor of the present application has studied on a configuration in which trenches are formed in the chip bonding region 10d of the upper surface 10a of the die pad 101.

First, the inventor has studied on a configuration in which a plurality of trench portions (trenches) 104 are formed inside the chip bonding region 10d as a die pad 103 illustrated in FIG. 30 and included in a semiconductor device 102 according to the second comparative example of the present embodiment. In the die pad 103 illustrated in FIG. 30, the trench portions 104 are formed at four corner portions 11 of the chip bonding region 10d, respectively. The trench portions 104 are hollows formed by, for example, an etching process, and the die pad 103 is thin in regions where the trench portions 104 are formed as illustrated in FIG. 31. Note that the trench portions 104 are formed only inside the chip bonding region 10d but not formed outside the chip bonding region 10d. In other words, non-trench regions 105 which are inside the chip bonding region 10d and where the trenches are not formed are arranged on extended lines of the trench portions 104. The inventor of the present application has considered that a value of the stress at each corner portion 11 can be decreased because a thermal expansion amount or a thermal shrink amount (hereinafter, referred to as strain amount) of the die pad 103 having the larger linear expansion coefficient than that of the semiconductor chip 3 (see FIG. 31) can be decreased in the regions where the die pad 103 is thin. Moreover, the inventor has also considered that, even if the peel-off has occurred at the corner portions 11, the expansion of the peel-off can be suppressed by extending each of the trench portions 104 in a direction which intersects with a diagonal line of two diagonal lines of the chip bonding region 10d which connects between the corner portions 11 at which the trench portions 104 are arranged.

However, as a result of evaluation for the semiconductor device 102 illustrated in FIG. 30, it has been found out that the problem of the peel-off of the bonding interface between the die-bond material 2 and the semiconductor chip 3 or the die pad 103 after performing the reflow step is not solved. In addition, it has been found out that such a peel-off phenomenon similarly occurs even if the number of the trench portions 104 illustrated in FIG. 30 is further increased. The reason therefor is conceived as below.

That is, as described above, the stress (shearing stress) occurring at the bonding interface between the die-bond material 2 and the semiconductor chip 3 or the die pad 103 becomes larger as the distance from the center portion 12 of the die pad 103 is farther, and becomes the largest at the corner portions 11 of the chip bonding regions 10d positioned farthest from the center portion. This is because the strain amount of the die pad 103 becomes larger as the distance from the center portion is larger. Here, in the case of the die pad 103 illustrated in FIG. 30, the strain amount of the die pad 103 is small in the region where the trench portion 104 is formed. However, since the non-trench regions 105 exist on the extended lines of the trench portions 104 inside the chip bonding region 10d, the strain amount of the die pad 103 at the corner portions 11 cannot be sufficiently decreased. As a result, the stress at the corner portions 11 cannot be decreased.

Also, when the peel-off occurs at the corner portions 11, the linear expansion of the peel-off from the corner portions 11 toward the center portion 12 can be prevented to some extent by extending each trench portion 104 along the direction intersecting with the diagonal line for connecting between the corner portions 11 at which the trench portions 104 are arranged. However, due to the existence of the non-trench regions 105, the peel-off goes around from the non-trench regions 105 so as to be expanded toward the center portion 12, and, as a result, the peel-off is expanded to such a wide range as the bonding interface.

Further, the die-bond material 2 is buried inside the trench portions 104. In a case that the non-trench regions 105 exist on both ends of each of the trench portions 104 as the die pad 103, it is difficult to reliably bury the die-bond material 2 inside the trench portions 104, and therefore, voids (air bubbles) easily remain inside the trench portions 104. This is because a path for discharging the air inside the trench portions 104 upon the bonding of the semiconductor chip 3 on the die pad 103 is narrow. And, if the moisture (for example, moisture contained in the sealing resin 6 illustrated in FIG. 31) remains in the voids remaining inside the trench portions 104, the moisture rapidly expands (explodes) in the reflow step, and therefore, easily triggers the peel-off.

In consideration of the above-described study results which have been uniquely studied, the inventor of the present application has found out the structure of the die pad 10 illustrated in FIGS. 7 and 8.

In the die pad 10 of the present embodiment illustrated in FIGS. 7 and 8, a trench portion (trench) 13 is formed at each of the corner portions 11 of the chip bonding region 10d having the quadrangular planar shape as illustrated in FIG. 7. More specifically, a first trench 13a is formed at a first corner portion 11a of the chip bonding region 10d. Also, a second trench 13b is formed at a second corner portion 11b opposed to the first corner portion 11a so as to interpose the center portion 12 therebetween at which the two diagonal lines of the chip bonding region 10d intersect with each other in a plan view. Further, a third trench 13c is formed at a third corner portion 11c positioned between the first corner portion 11a and the second corner portion 11b (more specifically, on a second diagonal line different from a first diagonal line for connecting between the first corner portion 11a and the second corner portion 11b) in the plan view. Still further, a fourth trench 13d is formed at a fourth corner portion 11d opposed to the third corner portion 11c so as to interpose the center portion 12 of the chip bonding region 10d therebetween in the plan view.

Still further, each of the first trench 13a and the second trench 13b is formed along a first direction which intersects with (preferably, orthogonal to) the first diagonal line for connecting between the first corner portion 11a and the second corner portion 11b of the chip bonding region 10d in the plan view. Also, each of the third trench 13c and the fourth trench 13d is formed along a second direction which intersects with (preferably, orthogonal to) the second diagonal line of the chip bonding region 10d which intersects with the first diagonal line in the plan view.

Still further, each of the first trench 13a, the second trench 13b, the third trench 13c, and the fourth trench 13d is formed from the chip bonding region 10d (region overlapped with the semiconductor chip 3) to a region outside the chip bonding region 10d (region not overlapped with the semiconductor chip 3) in the plan view. More specifically, each trench portion 13 is formed from the outside of the chip bonding region 10d through the inside of the chip bonding region 10d to another outside of the chip bonding region 10d. In other words, both ends of each of the trench portions 13 are extended to the outside of the chip bonding region 10d.

As described above, by extending both ends of each trench portion 13 to the outside of the chip bonding region 10d, the trench portion 13 can be reliably interposed in a path heading from the center portion 12 to each of the corner portions 11 inside the chip bonding region 10d where the stress occurs. Therefore, the strain amount of the die pad 10 at each of the corner portions 11 can be decreased, and, as a result, the value of the stress (shearing stress) occurring at each of the corner portions 11 can be decreased. As a result, for example, as illustrated in FIG. 4, even if the heating to 260° C. or higher is performed as the reflow step when the semiconductor device 1 is mounted on the mounting substrate 20, the peel-off of the die-bond material 2 from the semiconductor chip 3 or the die pad 10 at each of the corner portions 11 can be suppressed. Note that, in the present embodiment, the stress occurring at each of the corner portions 11 of the chip bonding region 10d is decreased more than those of the semiconductor device 100 illustrated in FIG. 28 and the semiconductor device 102 illustrated in FIG. 30. However, portions inside the chip bonding region 10d illustrated in FIG. 7 where the stress is the highest are the corner portions 11. Therefore, if the peel-off of the die-bond material 2 at each of the corner portions 11 can be prevented, the peel-off thereof at the other portion inside the chip bonding region 10d can be also prevented.

Also, from a viewpoint of preventing or suppressing the expansion of the peel-off toward the center portion 12 when the peel-off has occurred at each of the corner portions 11, the both ends of each of the trench portions 13 are extended to the outside of the chip bonding region 10d as illustrated in FIG. 7, so that it can be prevented or suppressed that the peel-off goes around to expand to the center portion 12 as the above-described die pad 103 illustrated in FIG. 30. The expansion of the peel-off which has occurred at each of the corner portions 11 toward the center portion 12 results from the stress occurring inside the chip bonding region 10d. That is, when the peel-off occurs at each of the corner portions 11, the stress is concentrated on a non-peeled region positioned so as to have a second largest distance from the center portion 12, and the peel-off is gradually expanded toward the center portion 12. However, according to the present embodiment, the both ends of each trench portion 13 are extended to the outside of the chip bonding region 10d, and therefore, the expanding direction of the peel-off can be directed toward the outside of the chip bonding region 10d where the stress is released, so that the peel-off can be suppressed.

Also, from a viewpoint of efficiently suppressing the expansion of the peel-off, it is preferred that each of the trench portions 13 is formed along the direction which intersects with the diagonal line for connecting between the corner portions 11 at which the trench portions 13 are to be arranged as illustrated in FIG. 7. When the trench portion 13 is formed on the upper surface 10a of the die pad 10, the peel-off is expanded along the extending direction of the trench portion 13. Therefore, by forming the trench portion 13 along the direction which intersects with the direction heading from the corner portion 11 toward the center portion 12, the expanding direction of the peel-off can be reliably directed toward the outside of the chip bonding region 10d so as to release the stress. More particularly, when the trench portion 13 is formed along the direction orthogonal to the diagonal line for connecting between the corner portions 11 at which the trench portions 13 are to be arranged, an area of the peel-off can be suppressed at minimum.

Note that there are cases that the peel-off of the die-bond material 2 occurs at the bonding interface with the semiconductor chip 3 and at the bonding interface with the die pad 10 as described above. However, in the case that the die pad 10 has the larger linear expansion coefficient than that of the semiconductor chip 3 as the present embodiment, the peel-off at both of the interfaces can be prevented or suppressed by forming the trench portions 13 in the die pad 10 having the larger strain amount due to the heat. This is because the stress occurring at the bonding interface between the semiconductor chip 3 and the die-bond material 2 can be also decreased by decreasing the strain amount of the die pad 10 having the larger strain amount due to the heat than that of the semiconductor chip 3. Also, by a relation between a magnitude of the stress occurring at each of the bonding interfaces and a bonding force at each of the bonding interfaces, it is determined at which one of the bonding interfaces the peel-off occurs. For example, in the case that the semiconductor chip 3 is mainly made of silicon (Si) and the die pad 10 is mainly made of copper (Cu) as the present embodiment, the peel-off tends to occur at the bonding interface between the die pad 10 and the die-bond material 2. Therefore, it is particularly preferred to form the trench portion 13 in the die pad 10.

Further, by extending the both ends of each of the trench portion 13 to the outside of the chip bonding region 10d, the air inside the trench portion 13 can be discharged in a large space outside the chip bonding region 10d when the semiconductor chip 3 is bonded on the die pad 10, and therefore, the generation (remaining) of voids can be prevented or suppressed. Therefore, the remaining of the moisture inside the voids can be prevented or suppressed, and therefore, the rapid expansion of the moisture in the reflow step performed when the semiconductor device 1 is mounted on the mounting substrate 20 illustrated in FIG. 4 can be suppressed. Therefore, the trigger for the occurrence of the peel-off can be decreased.

Incidentally, from a viewpoint of decreasing the stress occurring at the corner portions 11, it is preferred to ensure the area of the region where the die pad 10 is thin (that is, a planar area of the trench portions 13) as large as possible in the path heading from the center portion 12 to each of the corner portions 11. However, if the planar area (trench width) of the trenches 13 is excessively increased, there is a risk that rigidity of the die pad 10 is reduced, which results in breakage of the die pad 10 during the manufacturing steps.

Accordingly, in the present embodiment, as illustrated in FIG. 7, a plurality of rows of the trench portions 13 are formed at each of the corner portions 11. In detailed explanation, the first trench 13a is formed in a plurality of rows from the first corner portion 11a of the chip bonding region 10d toward the center portion 12 of the chip bonding region 10d. Also, the second trench 13b is formed in a plurality of rows from the second corner portion 11b of the chip bonding region 10d toward the center portion 12 of the chip bonding region 10d. Further, the third trench 13c is formed in a plurality of rows from the third corner portion 11c of the chip bonding region 10d toward the center portion 12 of the chip bonding region 10d. Still further, the fourth trench 13d is formed in a plurality of rows from the fourth corner portion 11d of the chip bonding region 10d toward the center portion 12 of the chip bonding region 10d. In the present embodiment, the trench portion 13 is formed in, for example, five rows at each of the corner portions 11 as illustrated in FIG. 7. And, a trench width of each of the trench portions 13 is, for example, 100 μm.

As described above, by forming the plurality of rows of the trench portions 13 at each of the corner portions 11, the area of the region where the die pad 10 is thin (that is, a total value of the planar areas of the trench portions 13) in the paths heading from the center portion 12 to the corner portions 11 can be increased larger than that of the case of formation of only one row of the trench portion 13. Also, the trench width of each of the trench portions 13 can be set within a range in which the rigidity of the die pad 10 can be suppressed, and therefore, the breakage of the die pad 10 during the manufacturing steps can be prevented or suppressed.

Further, as illustrated in FIG. 7, the formation of the plurality of rows of trench portions 13 at each of the corner portions 11 is also preferred from a viewpoint of preventing the expansion of the peel-off. That is, when the peel-off occurs at the corner portion 11 and expands to the trench portion 13 which is the closest to the corner portion 11, the stress at a boundary between the peeled region and the non-peeled region becomes the largest. And, when the rapid expansion of the moisture which triggers the peel-off occurs in this state, there is a possibility that the peel-off further occurs at the boundary. However, even if such a second peel-off has occurred, expansion of the second peel-off can be stopped at the region where the trench portion 13 which is the second closest to the corner portion 11 is formed. As described above, by forming the plurality of rows of trench portions 13 at each of the corner portions 11, the expansion of the peel-off can be suppressed even if the peel-off occurs a plurality of times. For example, in the case of the formation of the five rows of trench portions 13 at each of the corner portions 11 as the present embodiment, the expansion of the peel-off to the center portion 12 can be almost reliably prevented.

As described above, according to the present embodiment, the expansion of the peel-off to the center portion 12 can be prevented or suppressed by forming the plurality of rows of the trench portions 13 at each of the corner portions 11, and therefore, the trench portion 13 is not formed at the center portion 12. More specifically, each of the first trench 13a, the second trench 13b, the third trench 13c, and the fourth trench 13d is not formed at the center portion 12 of the chip bonding region 10d. As already explained, the formation of the trench portion 13 in the chip bonding region 10d is effective from the viewpoint of suppressing the peel-off of the die-bond material 2 and suppressing the expansion of the peel-off thereof. However, by forming the trench portion 13, the die-bond material 2 is buried inside the trench portions 13. Therefore, an amount of the arranged die-bond material 2 is increased, and it is difficult to equalize the amount of the arranged die-bond material 2 inside the chip bonding region 10d. Accordingly, by not forming the trench portion 13 at the center portion 12 as the present embodiment, a total amount of the die-bond material 2 is decreased, so that it is easy to equally arrange the die-bond material 2 inside the chip bonding region 10d.

Also, in the present embodiment, the trench portions 13 are arranged so as not to intersect with each other inside the chip bonding region 10d. More specifically, the plurality of rows of the first trenches 13a, the plurality of rows of the second trenches 13b, the plurality of rows of the third trenches 13c, and the plurality of rows of the fourth trenches 13d are arranged so as not to intersect with each other inside the chip bonding region 10d. As described above, when the trench portions 13 are formed, the peel-off is expanded along the trench portions 13, and therefore, when the trench portions 13 are arranged so as not to intersect with each other inside the chip bonding region 10d, the expansion of the peel-off across the plurality of trench portions 13 can be prevented. Further, when the die-bond material 2 is buried inside the trench portions 13, it is preferred not to branch a burying path of the die-bond material 2 into a plurality of paths from a viewpoint of suppressing the generation of voids. In the present embodiment, the trench portions 13 are arranged so as not to intersect with each other inside the chip bonding region 10d, and therefore, the burying path of the die-bond material 2 is not branched, so that the arrangement is preferred also in the point that the generation of voids can be suppressed.

Still further, as illustrated in FIG. 7, on the upper surface 10a of the die pad 10 of the present embodiment, a trench portion (trench, fifth trench) 14 having an annular planar shape along sides of the chip bonding region 10d is formed in a periphery of the chip bonding region 10d. The trench portion 14 is formed in an annular (a frame) shape so as to surround the periphery of the chip bonding region 10d. From a viewpoint of improving the heat dissipation performance of the semiconductor device 1, it is preferred to decrease the amount of the arranged die-bond material 2 to shorten a distance between the lower surface 3b of the semiconductor chip 3 and the upper surface 10a of the die pad 10. Still further, in order to reliably bury the die-bond material 2 inside each of the trench portions 13, it is important to equalize the amount of the arranged die-bond material 2 inside the chip bonding region 10d. Accordingly, by forming the annular trench portion 14 surrounding the periphery of the chip bonding region 10d as the present embodiment, the die-bond material 2 is spread to the periphery of the chip bonding region 10d, and therefore, generation of a region where the die-bond material 2 is not buried in a part of the trench portions 13 can be prevented. Also, the die-bond material 2 can be reliably entirely spread to the chip bonding region 10d. This is because the trench portion 14 functions as a dam portion for suppressing the spread of the die-bond material 2 in the upper surface 10a of the die pad 10.

Still further, in the present embodiment, the both ends of each of the trench portions 13 are connected to the trench portion 14. In other words, the both ends of each of the first trenches 13a, the second trenches 13b, the third trenches 13c, and the fourth trenches 13d are coupled to the trench portion 14. As described above, by coupling the both ends of each of the trench portions 13 to the trench portion 14, the upper surface 10a of the die pad 10 can be partitioned as a region surrounded by the trench portions 13 and the trench portion 14 as illustrated in FIG. 7. Therefore, the expansion of the peel-off can be stopped inside the region surrounded by the trench portions 13 and the trench portion 14, so that the expansion of the peel-off can be more reliably suppressed.

As explained above, in the semiconductor device 1 of the present embodiment, the values of the stress (planar-direction stress; shearing stress) occurring at the corner portions 11 of the chip bonding region 10d can be decreased by forming the trench portions 13 whose both ends are extended to the outside of the chip bonding region 10d. Moreover, even when the die-bond material 2 is peeled off from the semiconductor chip 3 or the die pad 10, the expansion of the peel-off can be stopped inside a small range by forming each of the trench portions 13 along the direction which intersects with the diagonal line for connecting between the corner portions 11 at which the trench portions 13 are to be arranged. More particularly, in the semiconductor device 1 in which the lower surface 10b of the die pad 10 (see FIG. 8) is exposed from the sealing resin 6 in the lower surface 6b of the sealing resin 6 as the present embodiment, the moisture that triggers the peel-off tends to enter from the outside, and therefore, by applying the technique capable of suppressing the occurrence of the peel-off or the expansion of the peel-off explained in the present embodiment, they can be effectively suppressed.

Still further, as illustrated in FIG. 8, the trench portions 13 and the trench portion 14 are formed from the upper surface 10a of the die pad 10 toward the lower surface 10b thereof so as not to penetrate through the lower surface 10b but to reach a (substantially intermediate) portion between the upper surface 10a and the lower surface 10b of the die pad 10. In other words, the trench depth of each of the first trenches 13a, the second trenches 13b, the third trenches 13c (see FIG. 7), and the fourth trenches 13d (see FIG. 7) is shallower than the thickness of the die pad. For example, in the present embodiment, each trench portion 13 is formed so as to have a trench depth of about 75 $\mu$m, while the thickness of the die pad 10 is 150 $\mu$m. As described above, by forming each trench portion 13 so as not to penetrate through the die pad 10, leakage of the die-bond material 2 from the lower surface side of the die pad 10 in the manufacturing steps of the semiconductor device 1 can be prevented.

<Method of Manufacturing the Semiconductor Device>

Next, manufacturing steps of the semiconductor device 1 of the present embodiment will be explained. The semiconductor device 1 of the present embodiment is manufactured along an assembling flow explained below. Details of the steps will be explained below by using FIG. 9 to FIG. 23.

Figure 9:
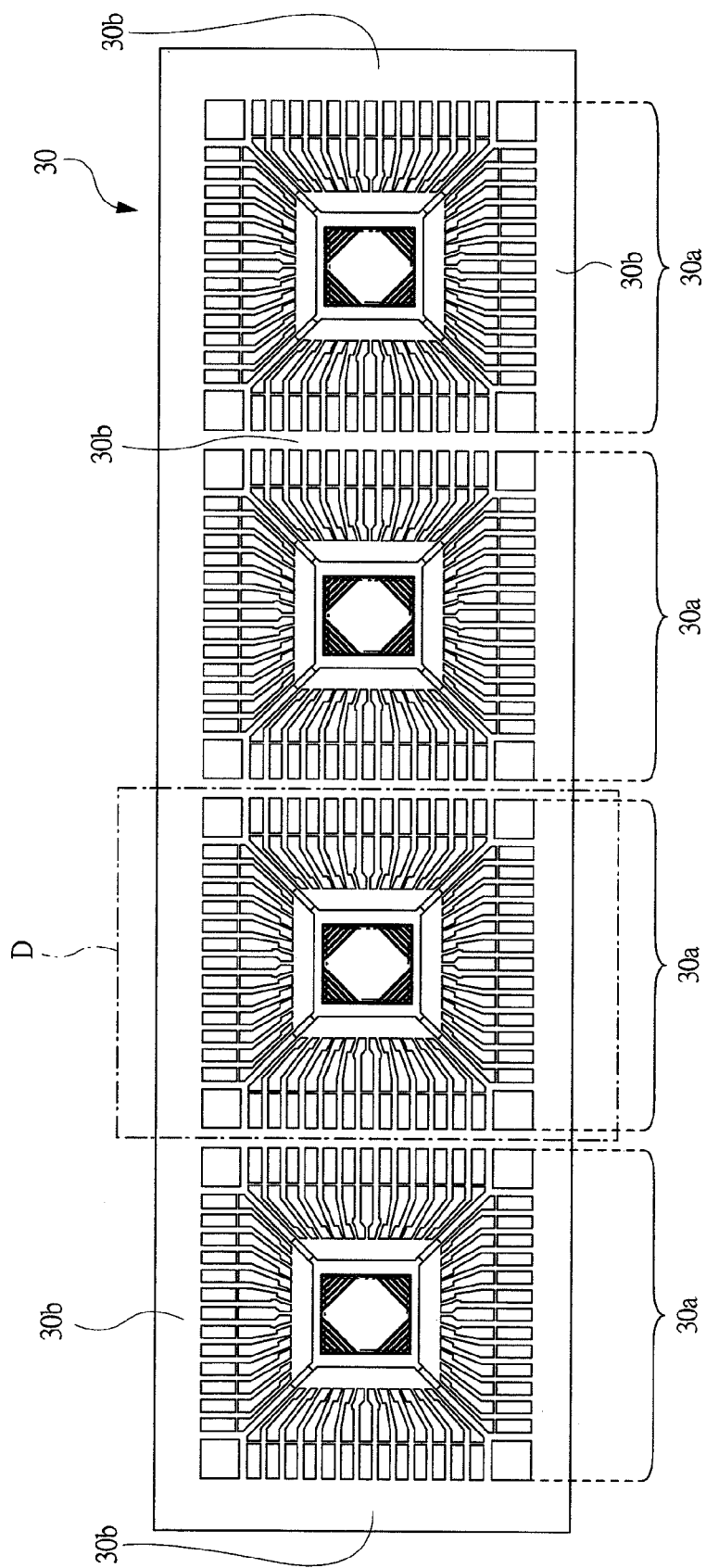
FIG. 9 is a plan view illustrating a lead frame prepared in a lead frame preparing step.
Figure 10:
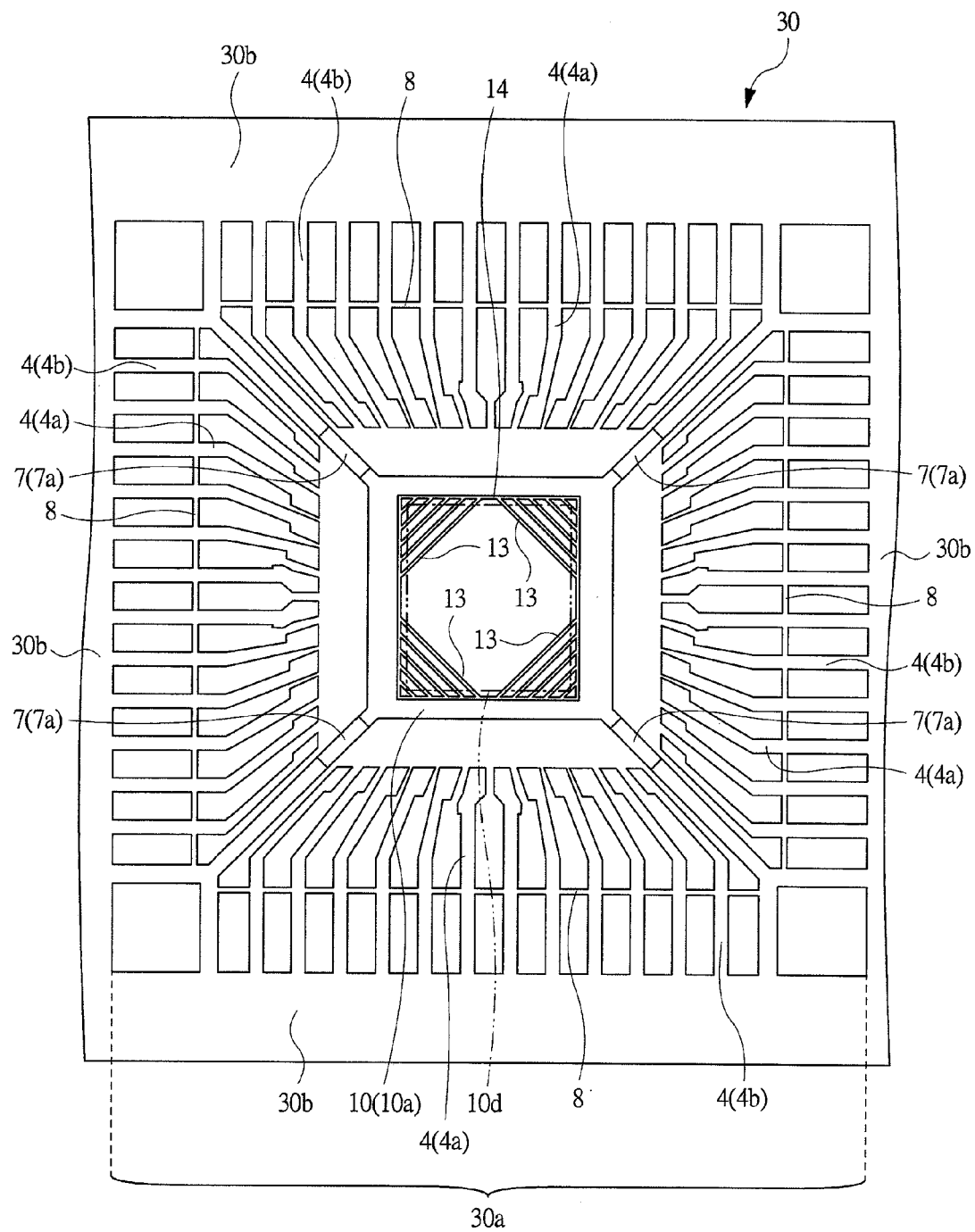
FIG. 10 is an enlarged plan view of a "D" portion of FIG. 9.

1. Lead Frame Preparing Step;

FIG. 9 is a plan view illustrating a lead frame which is prepared in a lead frame preparing step, and FIG. 10 is an enlarged plan view of a portion D of FIG. 9.

First, as the lead frame preparing step, a lead frame 30 as illustrated in FIG. 9 is prepared. In the lead frame 30 used in the present embodiment, a plurality of device regions 30a are formed inside a frame portion (frame body) 30b, and four device regions 30a are provided therein in the present embodiment. The lead frame is made of metal, and is made of, for example, copper (Cu) in the present embodiment. More specifically, a plating film made of, for example, nickel (Ni) is formed on a surface of a base material made of copper (Cu) as described above.

As illustrated in FIG. 10 which is a partial enlarged view of FIG. 9, each of the device regions 30a includes: the die pad 10 formed at a center portion of the device region 30a; and the plurality of leads 4 arranged in the periphery of the die pad 10. In the lead frame 30 prepared in the present step, the die pad 10 and the plurality of leads 4 are coupled to and integrally formed with each of the frame portions 30b. More specifically, the die pad 10 is connected to the plurality of (in the present embodiment, four) suspending leads 7 which are integrally formed with the die pad 10 and the frame portion 30b so as to couple between them, and is supported by the suspending leads 7. Also, the plurality of leads 4 are coupled to tie bars (dam bars) 8 which are integrally formed with the plurality of leads 4 and the frame portion 30b so as to couple between them, and are supported by the tie bars 8. Note that, in each of the plurality of suspending leads 7, the tilted portion 7a for arranging the die pad 10 as the offset arrangement (down-set arrangement) as described above has already been formed. That is, the upper surface 10a of the die pad 10 is arranged at a position lower than the upper surfaces of the plurality of leads 4. Also, in the present embodiment, the plurality of suspending leads 7 are connected to each corner portion of the die pad 10 having the quadrangular planar shape.

Further, as illustrated in FIG. 10, the chip bonding region 10d having the quadrangular planar shape is arranged on the upper surface 10a of the die pad 10. Still further, in the upper surface 10a, the plurality of trench portions 13 and the annular trench portion 14 explained in the above-described <Detailed Structure of Die Pad> are formed. Note that the detailed structures of the plurality of trench portions (trenches) 13 and the annular trench portion (trench) 14 are as already explained in the above-described <Detailed Structure of Die Pad>, and therefore, repetitive explanation for them will be omitted.

The lead frame 30 illustrated in FIGS. 9 and 10 can be formed as, for example, follows.

First, a thin plate made of copper (Cu) is prepared, and the die pad 10, the suspending leads 7, the leads 4, and the tie bars 8 are formed with using a predetermined pattern illustrated in FIG. 10 by an etching process or a pressing process.

Next, as illustrated in FIG. 10, the plurality of trench portions 13 and the annular trench portion 14 are formed in the upper surface 10a of the die pad 10 (in a trench-portion forming step). The trench portions 13 and 14 can be formed by, for example, an etching process in a state that a mask (whose illustration is omitted) having through holes formed at positions where the trench portions 13 and 14 are to be formed abuts against the upper surface 10a side of the die pad. Here, in the present embodiment, the trench portions 13 and 14 are formed so as not to penetrate through the die pad 10, and therefore, they are formed by such so-called half-etching process that the etching process is finished before the trench portions 13 and 14, which are formed by the etching, reach the lower surface side of the die pad 10. Note that, in the present embodiment, the trench depths of the trench portions 13 and 14 are formed to be about half of the thickness of the die pad 10 as described above. However, the trench depths of the trench portions 13 and 14 are not limited thereto. In the manufacturing steps of the semiconductor device 1, it is preferred to form the trench portions as deep as possible (for example, deeper than the half), as long as the breakage of the die pad 10 can be prevented.

Next, the position of the upper surface 10a of the die pad 10 is offset (in the present embodiment, down-set (set downward)) from upper surface positions of the leads 4 (in an offset step). In this offset step, the tilted portion 7a is formed by, for example, performing a bending process with using a punch (whose illustration is omitted) and a die (whose illustration is omitted) to a part of the suspending lead 7. Note that it is easier to arrange the mask (etching mask) in a case that the above-described trench-portion forming step is performed before the offset step, and therefore, the offset step is performed after the trench-portion forming step in the present embodiment. However, the offset step can be also performed before the trench-portion forming step. In this case, the offset step is performed before forming the trench portions 13 and 14, so that the damage of the die pad 10 upon the offset process can be suppressed.

Figure 11:
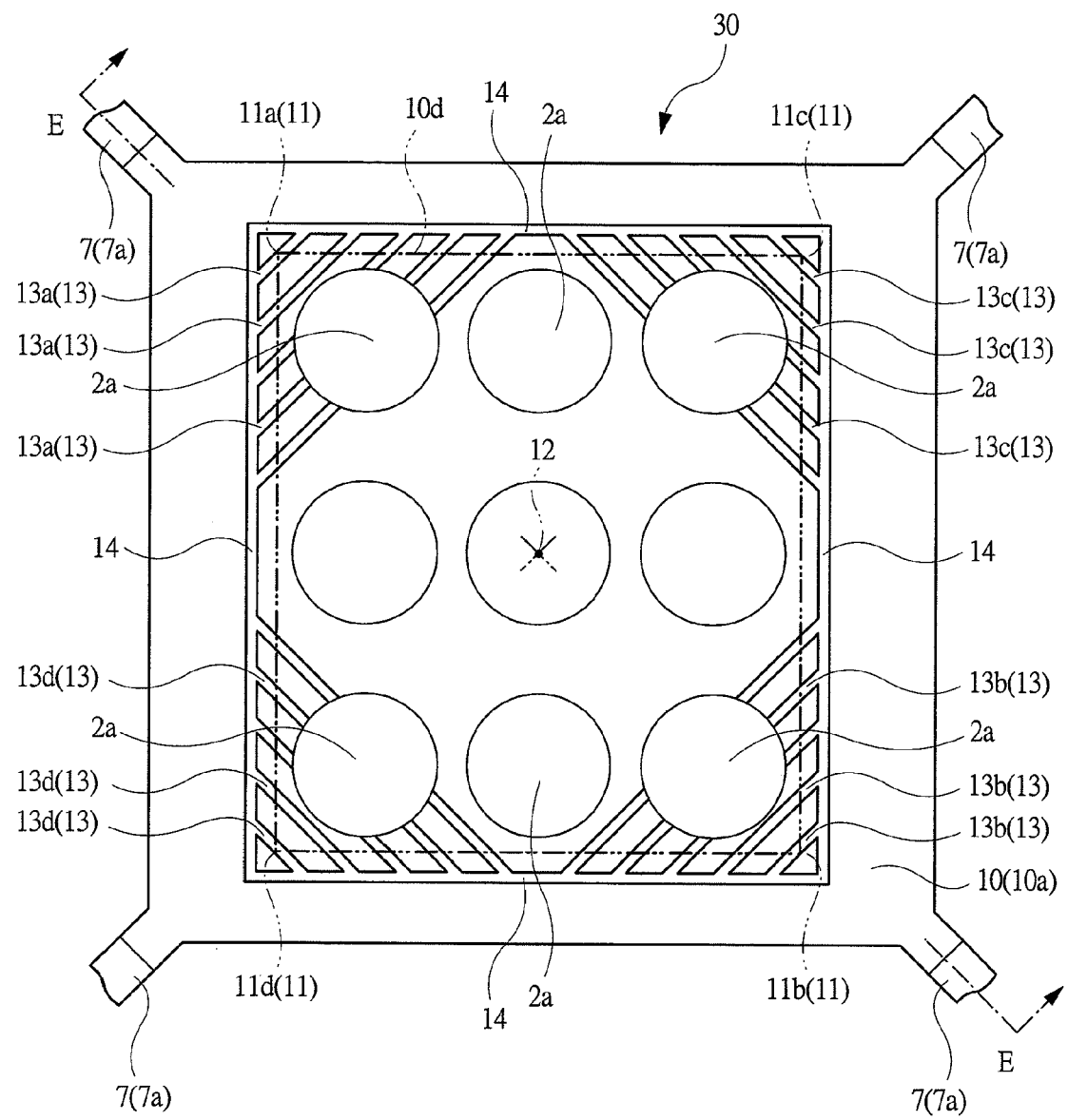
FIG. 11 is an enlarged plan view illustrating a state that bonding paste is arranged on a die pad illustrated in FIG. 10.
Figure 12:
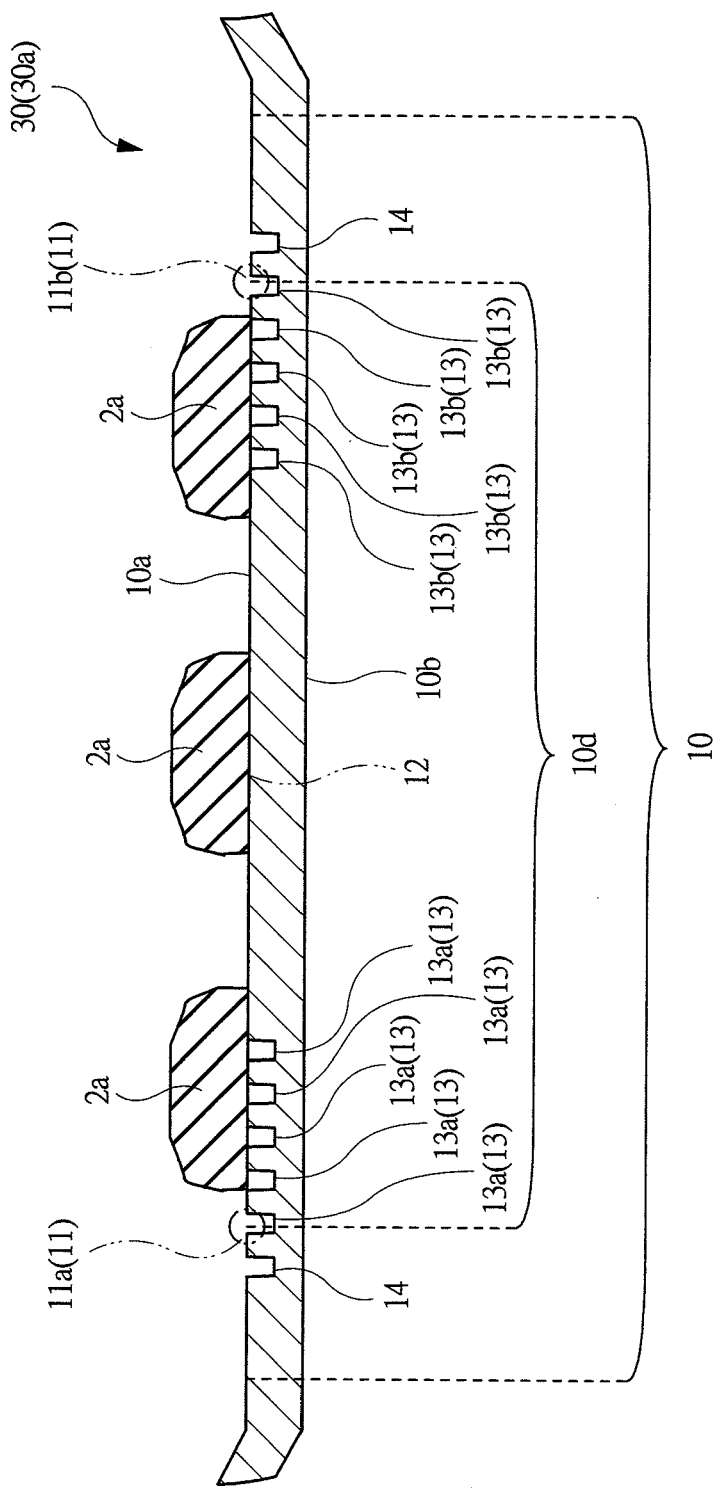
FIG. 12 is an enlarged cross-sectional view taken along a line E-E of FIG. 11.
Figure 13:
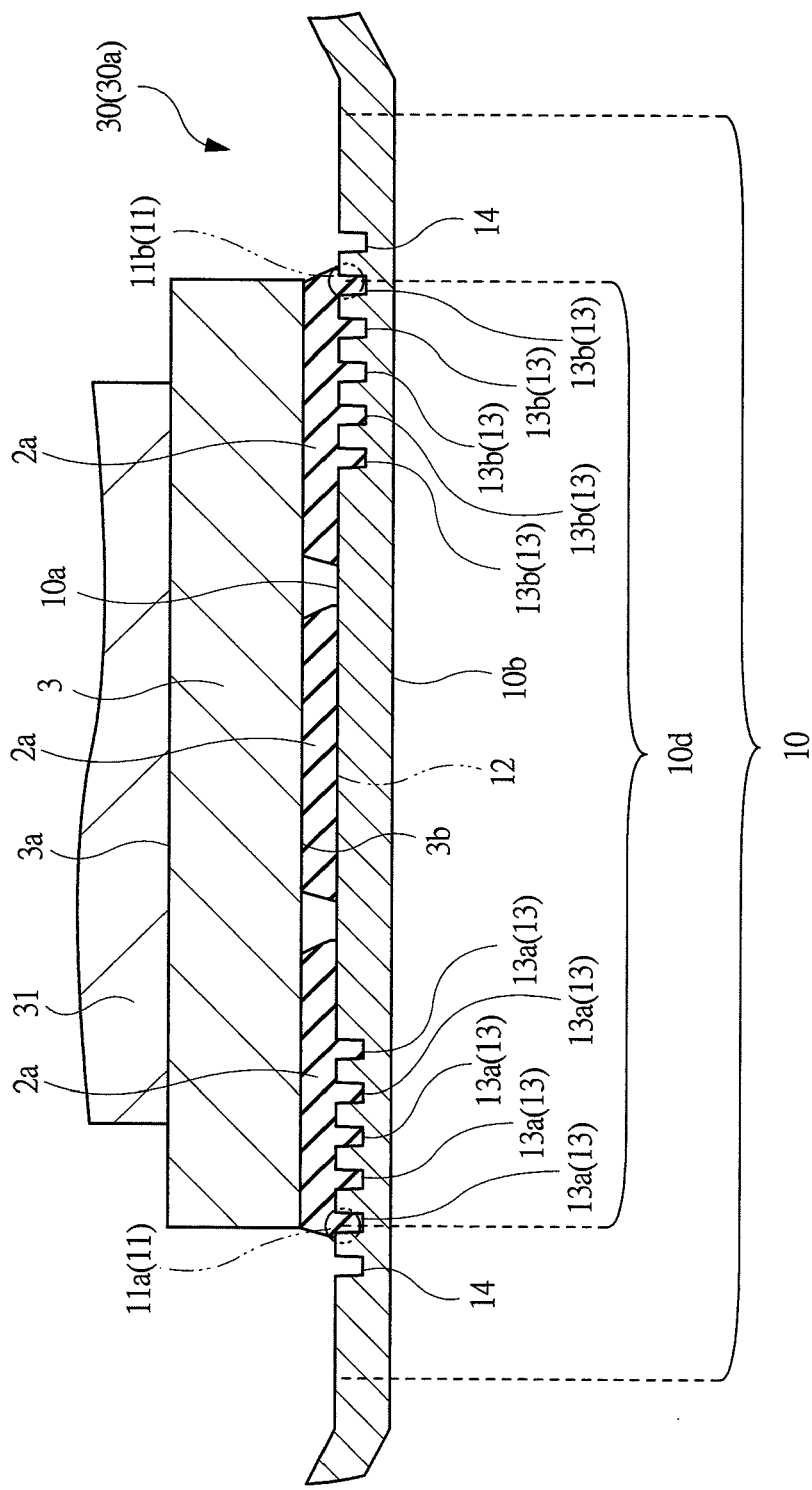
FIG. 13 is an enlarged cross-sectional view illustrating a state that a semiconductor chip is pressed against a chip bonding region illustrated in FIG. 12.

2. Die Bonding Step;

FIG. 11 is an enlarged plan view illustrating a state that bonding paste is arranged on the die pad illustrated in FIG. 10, and FIG. 12 is an enlarged cross-sectional view taken along a line E-E of FIG. 11. FIG. 13 is an enlarged cross-sectional view illustrating a state that the semiconductor chip is pressed against the chip bonding region illustrated in FIG. 12. Also, FIG. 14 is an enlarged plan view illustrating a state that the semiconductor chip is mounted on the chip bonding region illustrated in FIG. 11 so that the bonding paste is spread over the entire chip bonding region, and FIG. 15 is an enlarged cross-sectional view taken along a line F-F of FIG. 14.

Figure 14:
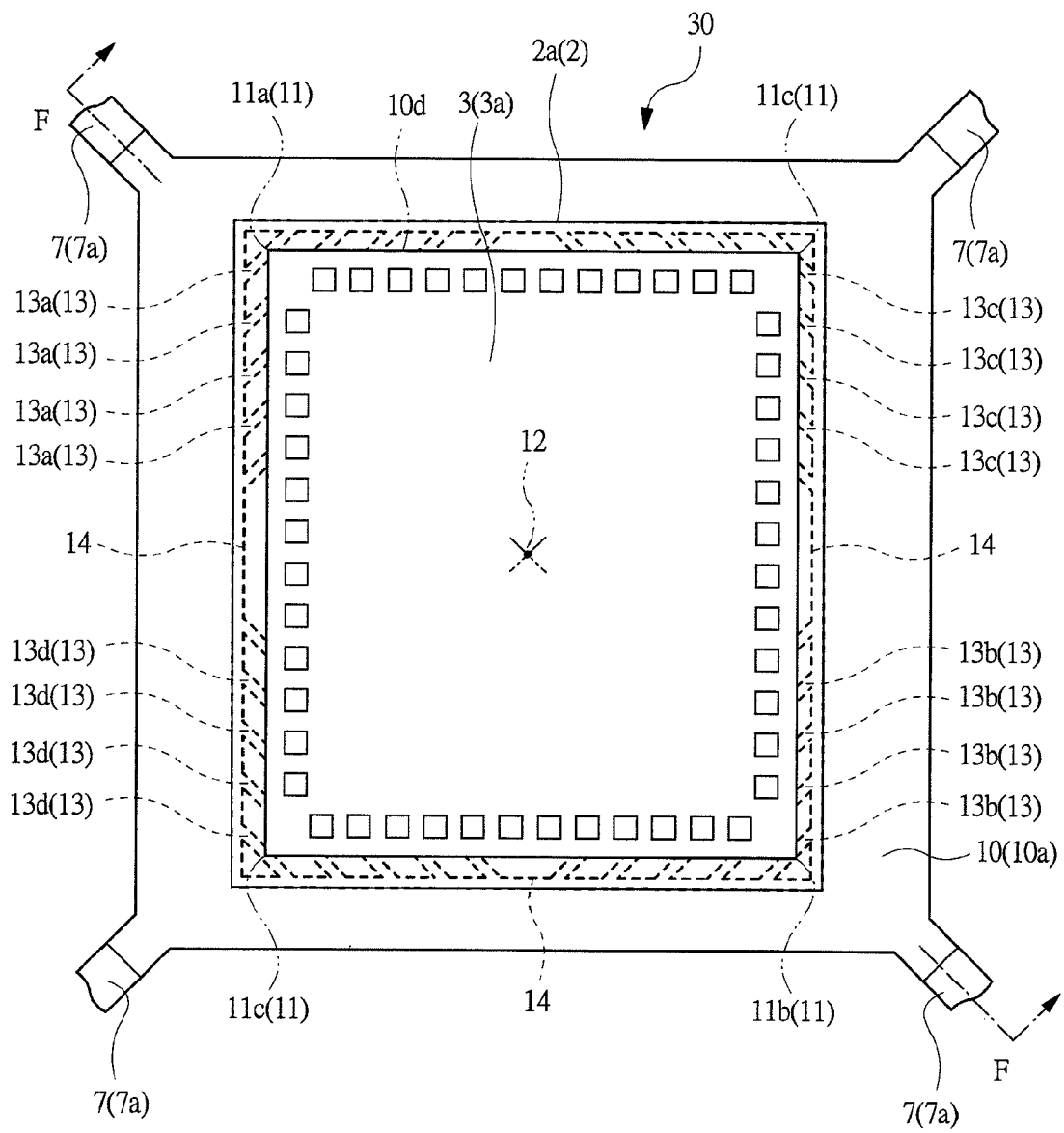
FIG. 14 is an enlarged plan view illustrating a state that the semiconductor chip is mounted on the chip bonding region illustrated in FIG. 11 and the bonding paste is entirely spread over the chip bonding region.
Figure 15:
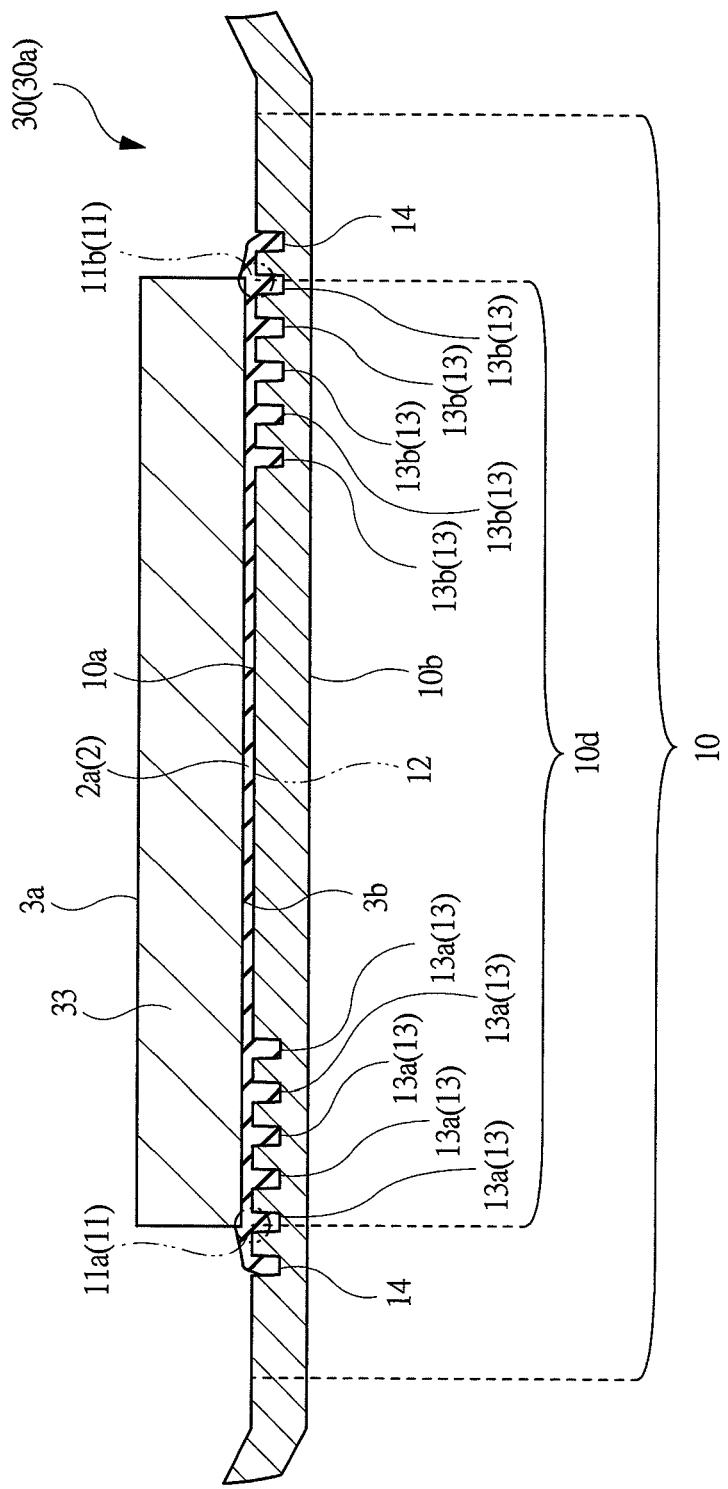
FIG. 15 is an enlarged cross-sectional view taken along a line F-F of FIG. 14.

Next, as a die bonding step, as illustrated in FIGS. 14 and 15, the semiconductor chip 3 is mounted on the chip bonding region 10d of the die pad 10 so as to interpose the die-bond material 2 therebetween. In the present embodiment, as illustrated in FIG. 15, the bonding is performed by such so-called face-up mounting method that the lower surface 3b of the semiconductor chip 3 (the surface on the opposite side of the upper surface 3a on which the plurality of electrode pads 3c (see FIG. 14) are formed) is mounted thereon in a state that the lower surface 3b is opposed to the upper surface 10a of the die pad 10.

Generally, as an adhesive material for bonding and fixing the semiconductor chip on the die pad, there are a paste-like (liquid-like) adhesive material and a tape-like (sheet-like) adhesive material. In a case of using the paste-like (which is a state having fluidity and higher viscosity (for example, higher than that of water)) adhesive material, the adhesive material (bonding paste) previously arranged (coated) on the die pad is pressed by the semiconductor chip when the semiconductor chip is mounted thereon, so that the adhesive material is spread for bonding. Then, the adhesive material is hardened to fix the semiconductor chip. On the other hand, in a case of using the tape-like adhesive material, one of adhesive layers of a tape obtained by forming the adhesive layers (viscid layers) on both surfaces of a base material is previously pasted on a bonding surface of the semiconductor chip, and the other adhesive layer is pasted on the chip bonding region of the die pad for the bonding. Also in this case of using the tape-like adhesive material, the tape-like adhesive material is hardened after the bonding to fix the semiconductor chip 3.

In the present embodiment, the trench portions 13 are formed in the chip bonding region 10d of the die pad 10, and therefore, the bonding paste 2a which is the paste-like adhesive material of the above-described two types of adhesive materials and which can be easily buried in the trench portions 13 is used. This is because the generation of the space between the trench portion 13 and the adhesive material (die-bond material 2) causes the moisture to remain inside the trench portion 13. Hereinafter, the die bonding step of the present embodiment with using the bonding paste 2a will be explained.

First, as illustrated in FIGS. 11 and 12, the bonding paste 2a is arranged (coated) on the chip bonding region 10d of the die pad 10. The bonding paste 2a is made of, for example, an epoxy-based thermoset resin. Also, in the present embodiment, from a viewpoint of improving the heat dissipation performance, metal particles each made of, for example, silver (Ag) or others are contained in the thermoset resin.

Further, in the present embodiment, from a viewpoint of substantially uniformly and entirely spreading the bonding paste 2a inside the chip bonding region 10d, the bonding paste 2a is arranged at a plurality of portions of the chip bonding region 10d as illustrated in FIG. 11. In FIG. 11, the bonding paste 2a is arranged at total nine portions which are the center portion 12 of the chip bonding region 10d, the corner portions 11, and the portions between the corner portions 11. A method of arranging the bonding paste 2a is not particularly limited. However, in the present embodiment, a dispensing method (method of discharging the bonding paste 2a from an non-illustrated nozzle onto the die pad 10) by which a coating amount and a coating position of the bonding paste 2a can be precisely controlled is used.

Next, as illustrated in FIG. 13, the lower surface (main surface, second main surface) 3b of the semiconductor chip 3 is pressed against the upper surface 10a of the chip bonding region 10d. In this manner, the bonding paste 2a can be buried in each of the plurality of trench portions 13. And, by further pressing the lower surface 3b of the semiconductor chip 3 against the upper surface 10a of the chip bonding region 10d, the bonding paste 2a is entirely spread over the chip bonding region 10d as being buried in the trench portions 13 as illustrated in FIG. 15. In this manner, the lower surface 3b of the semiconductor chip 3 is covered with the bonding paste 2a.

Here, in the present embodiment, the both ends of each of the trench portions 13 are extended to the outside of the chip bonding region 10d as illustrated in FIG. 14, and therefore, the bonding paste 2a is buried therein as pushing the air inside the trench portions 13 to the outside of the chip bonding region 10d by pressing the semiconductor chip 3. Therefore, in the die bonding step, the occurrence (remaining) of voids inside the trench portions 13 can be prevented or suppressed. That is, since the remaining of the moisture inside the voids can be suppressed, the rapid expansion of the moisture in the reflow step when the semiconductor device 1 is mounted on the mounting substrate 20 illustrated in FIG. 4 can be suppressed. Therefore, the triggers for the occurrence of the peel-off can be decreased.

Further, in the present embodiment, the trench portions 13 are arranged so as not to intersect with each other inside the chip bonding region 10d. More specifically, the plurality of rows of the first trenches 13a, the plurality of rows of the second trenches 13b, the plurality of rows of the third trenches 13c, and the plurality of rows of the fourth trenches 13d are arranged so as not to intersect with each other inside the chip bonding region 10d. In other words, the burying path of the bonding paste 2a is not branched, and the bonding paste 2a buried in the trench portions 13 is sequentially pushed toward the outside of the chip bonding region 10d along the trench portions 13. Therefore, in the die bonding step, the occurrence of voids can be more reliably suppressed.

Still further, from a viewpoint of improving the heat dissipation performance, it is preferred to shorten the distance between the lower surface 3b of the semiconductor chip 3 and the upper surface 10a of the die pad 10. In the case of containing the metal particles in the die-bond material 2 (bonding paste 2a) as the present embodiment, a thermal conductive property is improved more than that of a die-bond material in which the metal particles are not contained. However, even in this case, the thermal conductive property is further improved by shortening the distance between the lower surface 3b of the semiconductor chip 3 and the upper surface 10a of the die pad 10. And, from the viewpoint of shortening the distance between the lower surface 3b of the semiconductor chip 3 and the upper surface 10a of the die pad 10, it is preferred to decrease the amount of the die-bond material 2 (bonding paste 2a) arranged between the lower surface 3b and the upper surface 10a. In the present embodiment, the distance between the lower surface 3b of the semiconductor chip 3 and the upper surface 10a of the die pad 10 is shorter than the trench depth of each trench portion 13. For example, as described above, while the trench depth of each trench portion 13 is about 75 μm, the distance between the lower surface 3b of the semiconductor chip 3 and the upper surface 10a of the die pad 10 is set to about 10 μm to 20 μm. In this manner, the heat dissipation performance can be improved by decreasing the amount of the die-bond material 2 (bonding paste 2a) arranged between the lower surface 3b and the upper surface 10a.

However, if the amount of the arranged die-bond material 2 (bonding paste 2a) is simply decreased, the die-bond material 2 (bonding paste 2a) is not spread in a part of the chip bonding region 10d, which results in a cause of bonding failure in some cases. That is, the amount of the die-bond material 2 (bonding paste 2a) arranged inside the chip bonding region 10d is not uniformed in some cases.

Accordingly, in the upper surface 10a of the die pad 10 of the present embodiment, the trench portion (trench, fifth trench) 14 having the annular planar shape along the sides of the chip bonding region 10d is formed in the periphery of the chip bonding region 10d. The trench portion 14 is formed in the annular (frame) shape so as to surround the periphery of the chip bonding region 10d. This manner can prevent the spread of the die-bond material 2 in the periphery of the chip bonding region 10d to cause the region where the die-bond material 2 is not buried in a part of the trench portions 13. Moreover, the die-bond material 2 can be reliably entirely spread over the chip bonding region 10d. This is because the trench portion 14 functions as a dam portion that suppresses the spread of the die-bond material 2 on the upper surface 10a of the die pad 10.

Also, when the trench portions 13 and the trench portion 14 are formed as slits which penetrate through the die pad 10, by pressing the semiconductor chip 3 against them, a part of the bonding paste 2a is leaked from the slits to the lower surface 10b side of the die pad 10. Therefore, the amount of the bonding paste 2a is lacked, which results in the bonding failure in some cases.

Accordingly, in the present embodiment, as illustrated in FIG. 15, the trench portions 13 and the trench portion 14 are formed so as not to penetrate through the lower surface 10b but to reach the (intermediate) portion between the upper surface 10a and the lower surface 10b of the die pad 10. In other words, the trench depth of each of the first trenches 13a, the second trenches 13b, the third trenches 13c (see FIG. 14), and the fourth trenches 13d (see FIG. 14) is shallower than the thickness of the die pad. For example, in the present embodiment, while the die pad 10 has a thickness of 150 μm, each trench portion 13 is formed so as to have a trench depth of about 75 μm. As described above, by forming each trench portion 13 so as not to penetrate through the die pad 10, the leakage of the die-bond material 2 from the lower surface side of the die pad 10 in the die bonding step can be prevented. Therefore, even by pressing the semiconductor chip 3, the bonding paste 2a is not leaked to the lower surface 10b side of the die pad 10, and can be entirely spread over the chip bonding region 10d.

Next, as illustrated in FIGS. 14 and 15, the bonding paste 2a is hardened to be the die-bond material 2. In the present embodiment, the bonding paste 2a contains the thermoset resin, and therefore, the lead frame 30 is subjected to heating treatment (at, for example, about 100° C. to 150° C.) to harden the bonding paste 2a.

Figure 16:
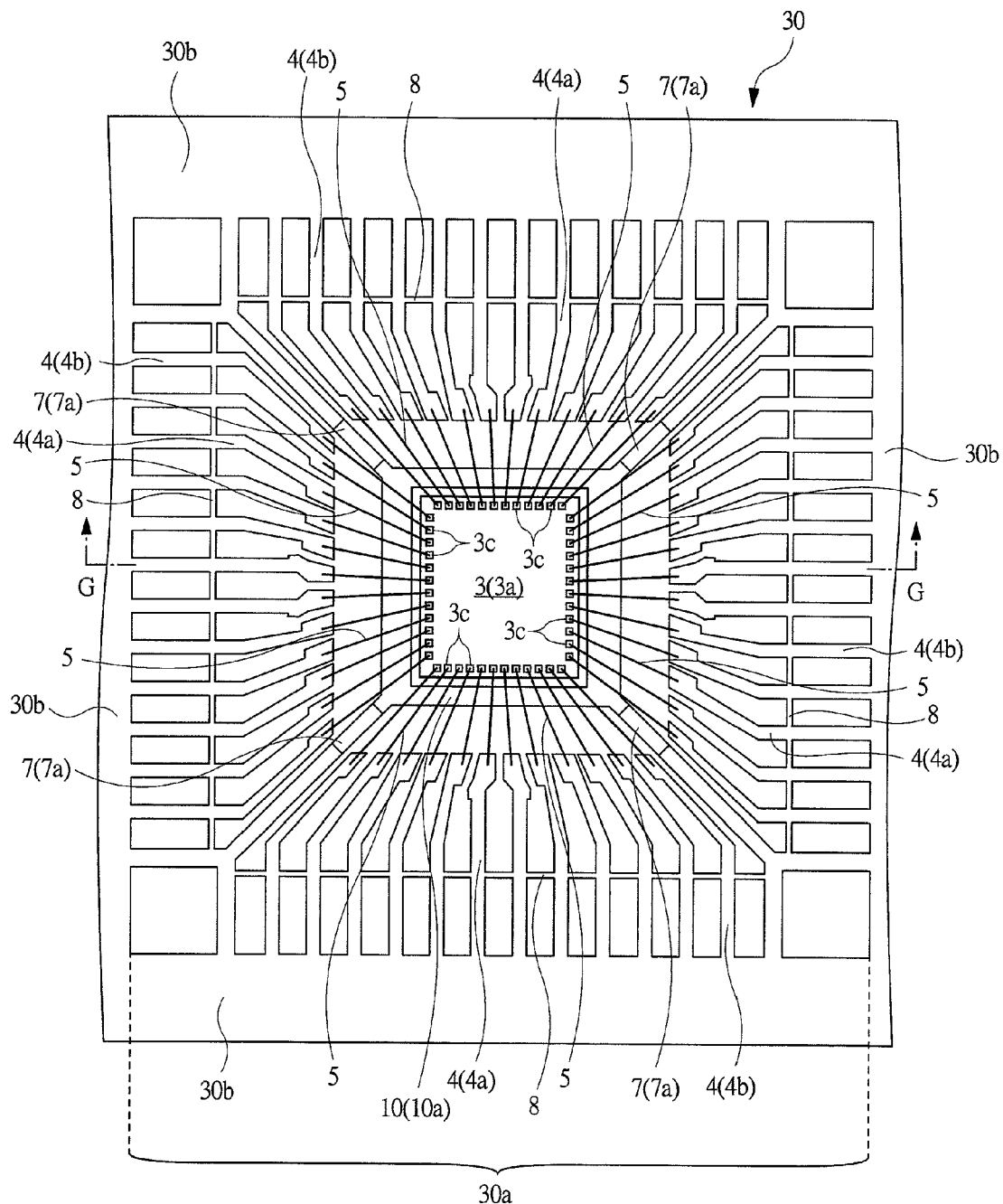
FIG. 16 is a plan view illustrating a state that the semiconductor chip illustrated in FIG. 14 and a plurality of leads are electrically connected to each other via wires.
Figure 17:
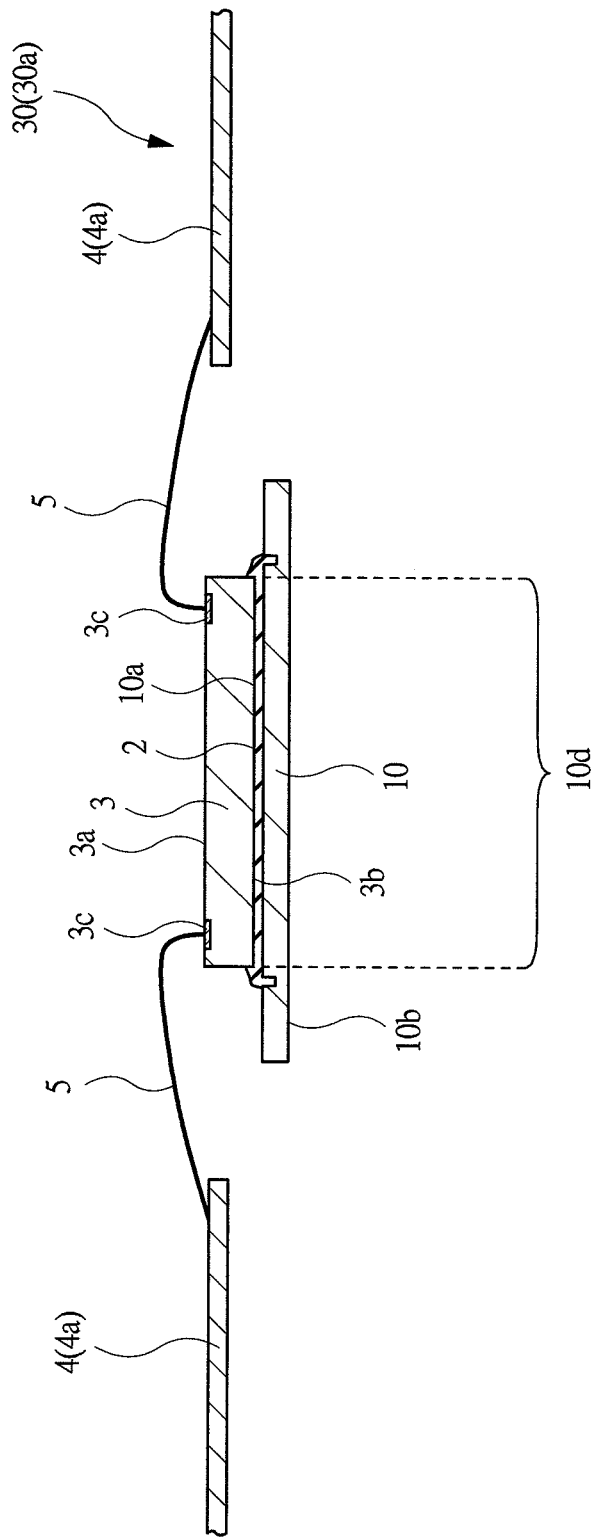
FIG. 17 is an enlarged cross-sectional view taken along a line G-G of FIG. 16.

3. Wire Bonding Step;

FIG. 16 is a plan view illustrating a state that the semiconductor chip illustrated in FIG. 14 and the plurality of leads are electrically connected to each other via the wires, and FIG. 17 is an enlarged cross-sectional view taken along a line G-G of FIG. 16.

Next, as a wire bonding step, as illustrated in FIGS. 16 and 17, a plurality of electrode pads 3c of the semiconductor chip 3 and the plurality of leads 4 are electrically connected to each other via a plurality of wires (conductive members) 5.

In the present step, for example, a heating stage (whose illustration is omitted) in which a concave portion is formed is prepared, and the lead frame 30 on which the semiconductor chip 3 is mounted is arranged on the heating stage so that the die pad 10 is positioned at the concave portion. And, the electrode pads 3c of the semiconductor chip 3 and the leads 4 are electrically connected to each other via the wires 5. Here, in the present embodiment, the wires 5 are coupled thereto by a so-called nail head bonding method in which the wires 5 are supplied through a capillary (whose illustration is omitted) and are coupled thereto by using ultrasonic waves and thermal compression bonding in combination.

Note that a temperature used in the present embodiment is, for example, 170 to 230° C. Also, as described above, the plating film is formed on a part (bonding region) of each of the leads 4, and a part of the wire 5 is electrically connected to the lead 4 via this plating film.

Also, each of the wires 5 is made of metal, and is made of, for example, gold (Au) in the present embodiment. Therefore, by forming the gold (Au) on each surface of the electrode pads 3c of the semiconductor chip 3 as described above, adhesiveness between the wires 5 and the electrode pads 3c can be improved.

Further, in the present embodiment, the wires are connected by a so-called forward bonding method of connecting a part of each wire to the electrode pad 3c of the semiconductor chip 3, and then, connecting the other part of the wire 5 to a bonding connecting region of the lead 4 (portion of an upper surface of the lead 4 on which the plating film is formed).

Figure 18:
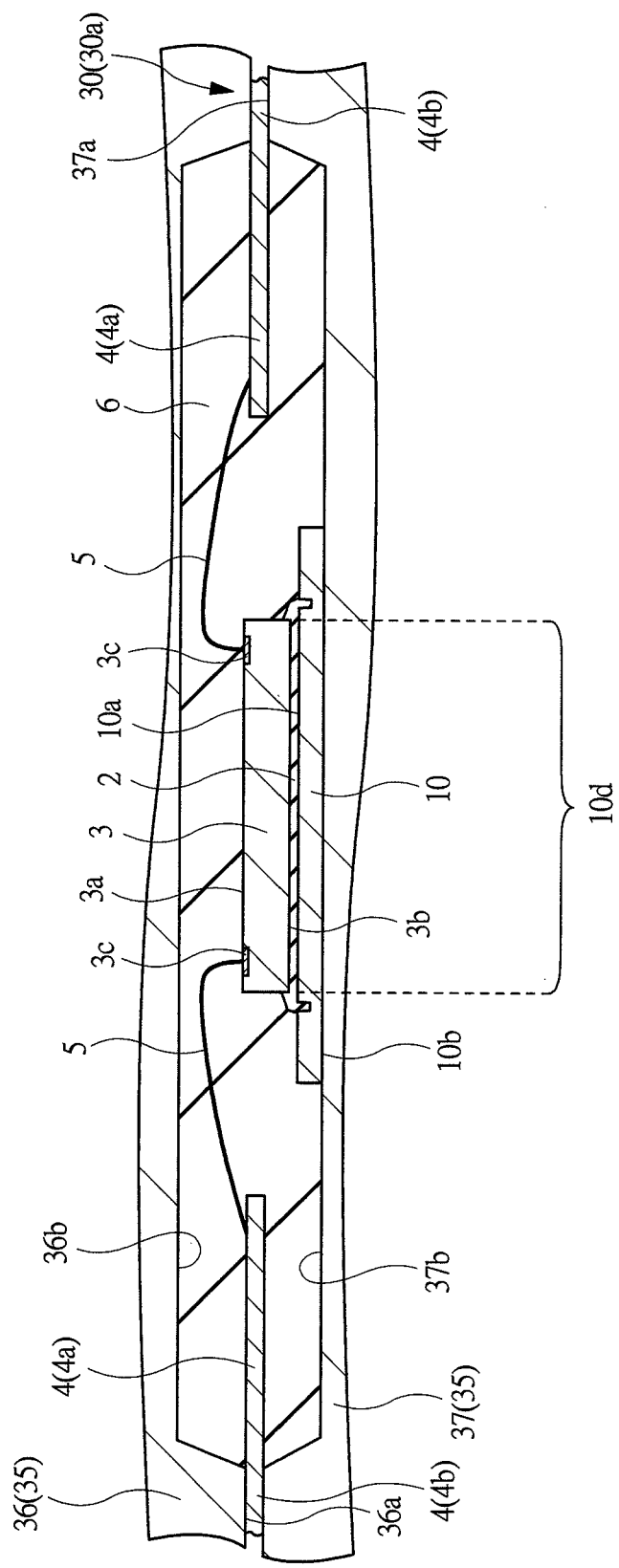
FIG. 18 is an enlarged cross-sectional view illustrating a state that the lead frame illustrated in FIG. 17 is clamped with a molding die to form a sealing resin.
Figure 19:
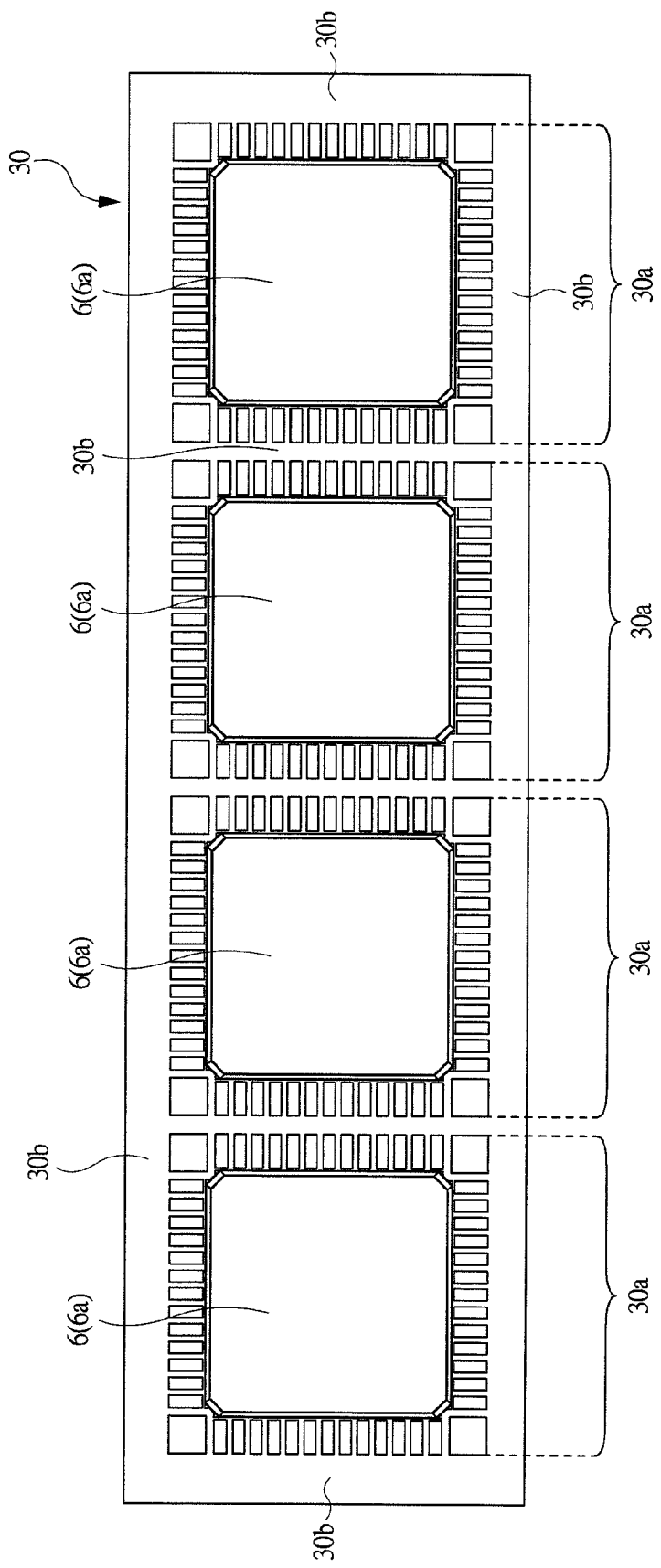
FIG. 19 is a plan view illustrating an entire structure of the lead frame in which the sealing resin is formed in each device region.

4. Molding Step;

FIG. 18 is an enlarged cross-sectional view illustrating a state that the lead frame illustrated in FIG. 17 is clamped with a molding die to form the sealing resin. And, FIG. 19 is a plan view illustrating an entire structure of the lead frame in which the sealing resin is formed in each device region.

Next, as a molding step, as illustrated in FIG. 18, the sealing resin (sealing body) 6 is formed to seal the semiconductor chip 3, the plurality of wires 5, and the die pad 10. In the present embodiment, the sealing resin 6 is formed to seal the upper surface 10a side of the die pad 10 so that the lower surface 10b of the die pad 10 is exposed from the sealing resin 6.

In the present step, first, as illustrated in FIG. 18, a molding die 35 is prepared, the molding die being provided with: an upper die (first die) 36 including a die surface (first die surface) 36a and a cavity (concave portion) 36b formed in the die surface 36a; and a lower die (second die) 37 including a die surface (second die surface) 37a opposed to the die surface 36a of the upper die 36 and a cavity (concave portion) 37b formed in the die surface 37a. And, the lead frame 30 which has been subjected to the wire bonding step is arranged inside the molding die 35 (between the upper die 36 and the lower die 37) so that the semiconductor chip 3 is positioned inside the cavity 36b of the upper die 36 and so that the die pad 10 is positioned inside the cavity 37b of the lower die 37. Here, in the present embodiment, in order to expose the lower surface 10b of the die pad 10 from the sealing resin 6, the lower surface 10b abuts against a bottom surface of the cavity 37b of the lower die 37.

Next, the lead frame 30 is clamped with the upper die 36 and the lower die 37. At this time when the lead frame 30 is clamped, a part of each of the plurality of leads 4 formed in the lead frame 30 is clamped. And, a part (inner lead 4a) of the lead 4 is arranged inside the cavities 36b and 37b, and the other part (outer lead 4b) of the lead 4 is clamped with the molding die 35 outside the cavities 36b and 37b.

Next, in the state that the lead frame 30 is clamped with the upper die 36 and the lower die 37, the sealing resin is supplied into a space formed by overlapping the cavity 36b of the upper die 36 with the cavity 37b of the lower die 37, so that the semiconductor chip 3, the plurality of wires 5, the part (inner leads 4a) of each of the plurality of leads 4, and the upper surface 10a of the die pad 10 are sealed with this sealing resin.

And, the sealing resin 6 is formed by thermally hardening the supplied sealing resin. Here, the sealing resin in the present embodiment is a thermoset epoxy-based resin and contains a plurality of fillers (silica). Also, a temperature of the molding die 35 in the present embodiment is, for example, about 180° C.

Next, after the thermoset step is performed, the lead frame 30 is taken out from the molding die, so that the lead frame 30 in which the sealing resin 6 is formed in each of the device regions 30a is obtained as illustrated in FIG. 19.

Next, the lead frame 30 taken out from the molding die 35 is carried to a baking furnace (whose illustration is omitted), and the lead frame 30 is subjected to the thermal treatment again. The reason is that, although the hardening process has been performed to the resin supplied into the cavities 36b and 37b in the thermoset step in the above-described sealing step, the resin is in a state that it is not completely hardened. This is for performing the sealing step as soon as possible to a next lead frame 30 to be carried to the molding die 35. Therefore, in the present embodiment, the hardening step of the sealing resin is divided into two steps, and the sealing resin 6 is completely hardened by the thermal treatment using the baking furnace. Note that, in the baking furnace, the lead frame 30 in which the sealing resin 6 is formed is arranged under a thermal atmosphere of, for example, 150° C., and heat is applied thereto for about three hours.

Figure 20:
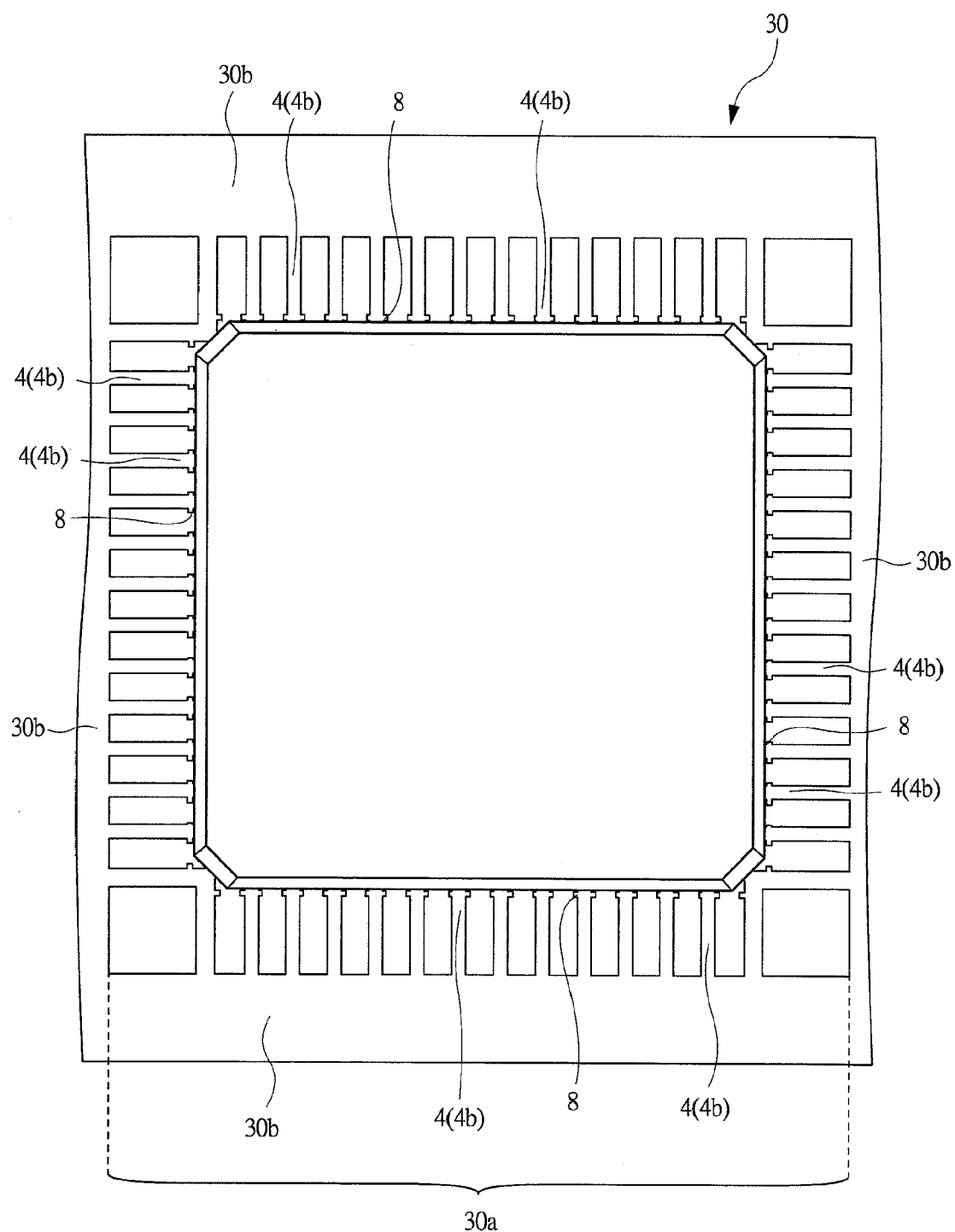
FIG. 20 is an enlarged plan view illustrating a state that a tie bar of the lead frame illustrated in FIG. 19 is cut.

5. Tie-Bar Cutting Step;

FIG. 20 is an enlarged plan view illustrating a state that the tie bars of the lead frame illustrated in FIG. 19 are cut.

Next, as a step of cutting the tie bars illustrated in FIG. 7, the tie bars 8 each for connecting between the leads 4 of the plurality of leads 4 which are adjacent to each other are cut as illustrated in FIG. 20. Note that, in the present embodiment, a part of each of the tie bars 8 is cut and removed by using an non-illustrated cutting blade (mold, punch).

6. Burr Removing Step;

Next, as a burr removing step, a resin burr (whose illustration is omitted) formed in the above-described molding step is removed. As a method of removing the resin burr, for example, removal by laser irradiation, removal by spraying high-pressure washing liquid, or a combination thereof can be used.

Figure 21:
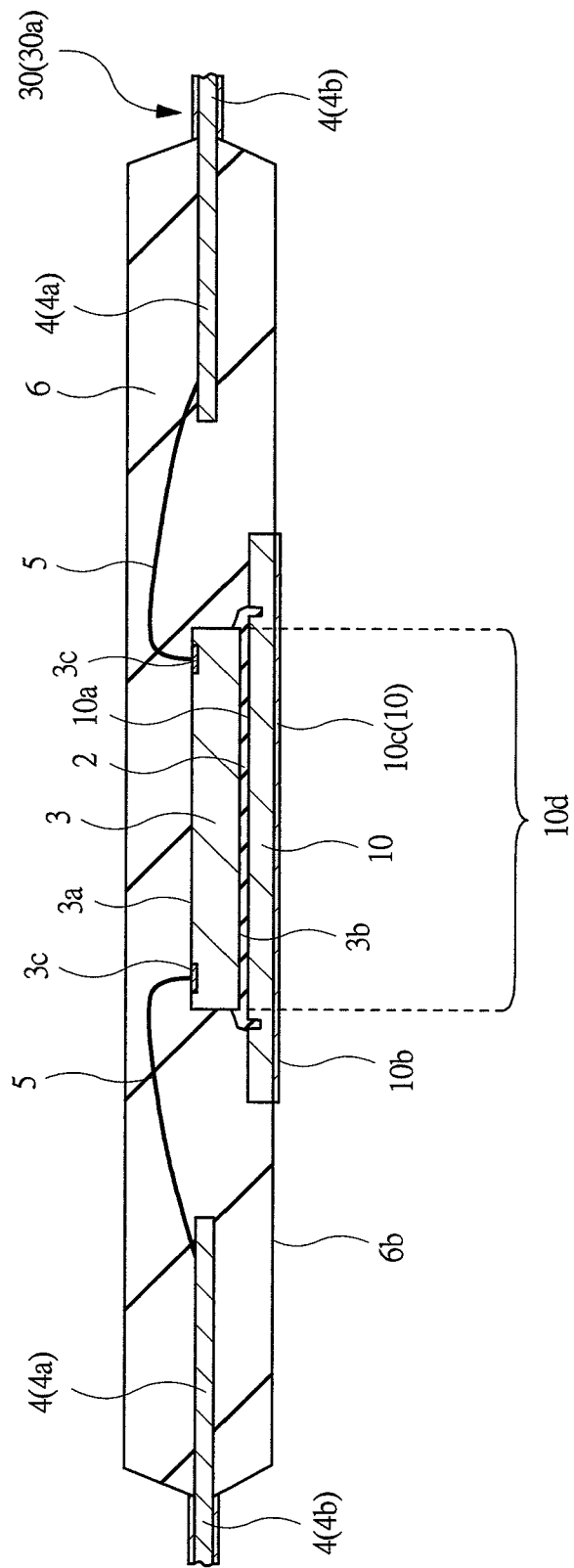
FIG. 21 is an enlarged cross-sectional view illustrating a state that an exterior plating film is formed on surfaces of the plurality of leads extended from the sealing resin.

7. Plating Step;

FIG. 21 is an enlarged cross-sectional view illustrating a state that the exterior plating film is formed on the surfaces of the plurality of leads extended from the sealing resin.

Next, as a plating step, the exterior plating film 4c is formed on the surfaces of the plurality of leads 4 (outer leads 4b) extended from the sealing resin 6. In the present embodiment, the lower surface 10b side of the die pad 10 is exposed from the lower surface 6b of the sealing resin 6, and therefore, the exterior plating film 10c is formed also on the lower surface 10b side of the die pad 10.

In the present step, the lead frame 30, which is a processing object to be plated, is arranged inside a plating bath (whose illustration is omitted) in which a plating solution (whose illustration is omitted) is contained, to collectively form the exterior plating films 4c and 10c by, for example, an electrolytic plating method.

Each of the exterior plating films 4c and 10c of the present embodiment is made of so-called lead-free solder, which does not substantially contain Pb (lead), such as only Sn (tin), Sn (tin) —Bi (bismuth), or Sn (tin)—Ag (silver)—Cu (copper). Here, the lead-free solder means a material having a lead (Pb) content of 0.1 wt % or less, and the content is determined as a standard of RoHs (Restriction of Hazardous Substances) directive.

Therefore, the plating solution used in the present plating step contains a metallic salt such as $Sn^{2+}$ or $Bi^{3+}$. Note that, in the present embodiment, Sn—Bi alloyed metal plating is used as an example of the lead-free solder plating. However, Bi can be replaced by metal such as Cu or Ag.

8. Marking Step;

Next, as a marking step, an identification symbol or others for identifying the semiconductor device is marked. In the present embodiment, the identification symbol is marked by, for example, irradiating laser to the upper surface 6a of the sealing resin 6 illustrated in FIG. 21.

Figure 22:
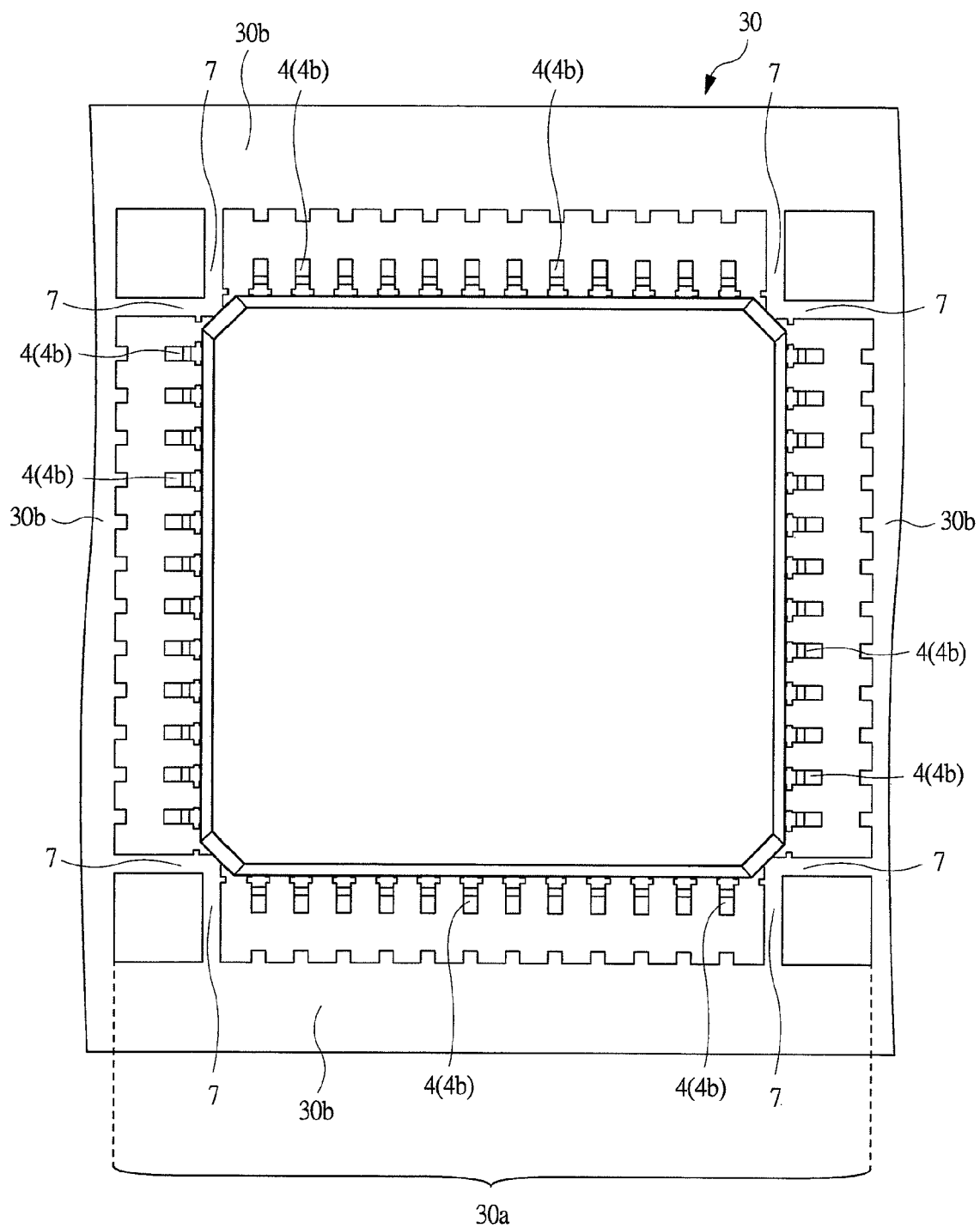
FIG. 22 is an enlarged plan view illustrating a state that the plurality of leads, on which the exterior plating film is formed, are cut from a frame portion of the lead frame to be formed.

9. Lead Shaping Step;

FIG. 22 is an enlarged plan view illustrating a state that the plurality of leads, on which the exterior plating film is formed, are cut from the frame portion of the lead frame and are shaped.

Next, as a lead shaping step, coupling portions of the plurality of leads 4 which are coupled to the frame portion 30b of the lead frame 30 are cut, and then, the leads 4 are subjected to a bending process so as to be shaped.

In the present step, first, the plurality of leads 4 coupled to and integrated with the frame portion 30b are cut at the coupling portions thereof to produce independent members (in a lead cutting step). In the present lead cutting step, the leads 4 are cut by arranging a die (supporting member; whose illustration is omitted) and a punch (cutting blade; whose illustration is omitted) on the lower surface side of the lead frame 30 and the upper surface side thereof so that the leads are pressed, respectively. Each of ends of the leads 4 cut by a pressing process as described above has a substantially-flat cutting surface as illustrated in FIG. 3, and, at the cutting surfaces, the base material of the leads 4 is exposed from the exterior plating film 4c. Through the present step, the plurality of leads 4 become the independent members which are separated from each other.

Next, the plurality of leads 4 which have been cut are subjected to the bending process to be shaped (in a bending step). In the present embodiment, for example, the outer leads 4b are shaped in the gull-wing shape as illustrated in FIG. 3.

Next, a tip of each of the leads 4 (outer leads 4b) is cut as illustrated in FIG. 3 to shorten each length of the leads 4 (in a lead-tip cutting step). In this lead-tip cutting step, as similarly to the lead cutting step, the leads 4 are cut by arranging a die (supporting member; whose illustration is omitted) and a punch (cutting blade; whose illustration is omitted) on the lower surface side of the lead frame 30 and the upper surface side thereof so that the leads are pressed, respectively.

Figure 23:
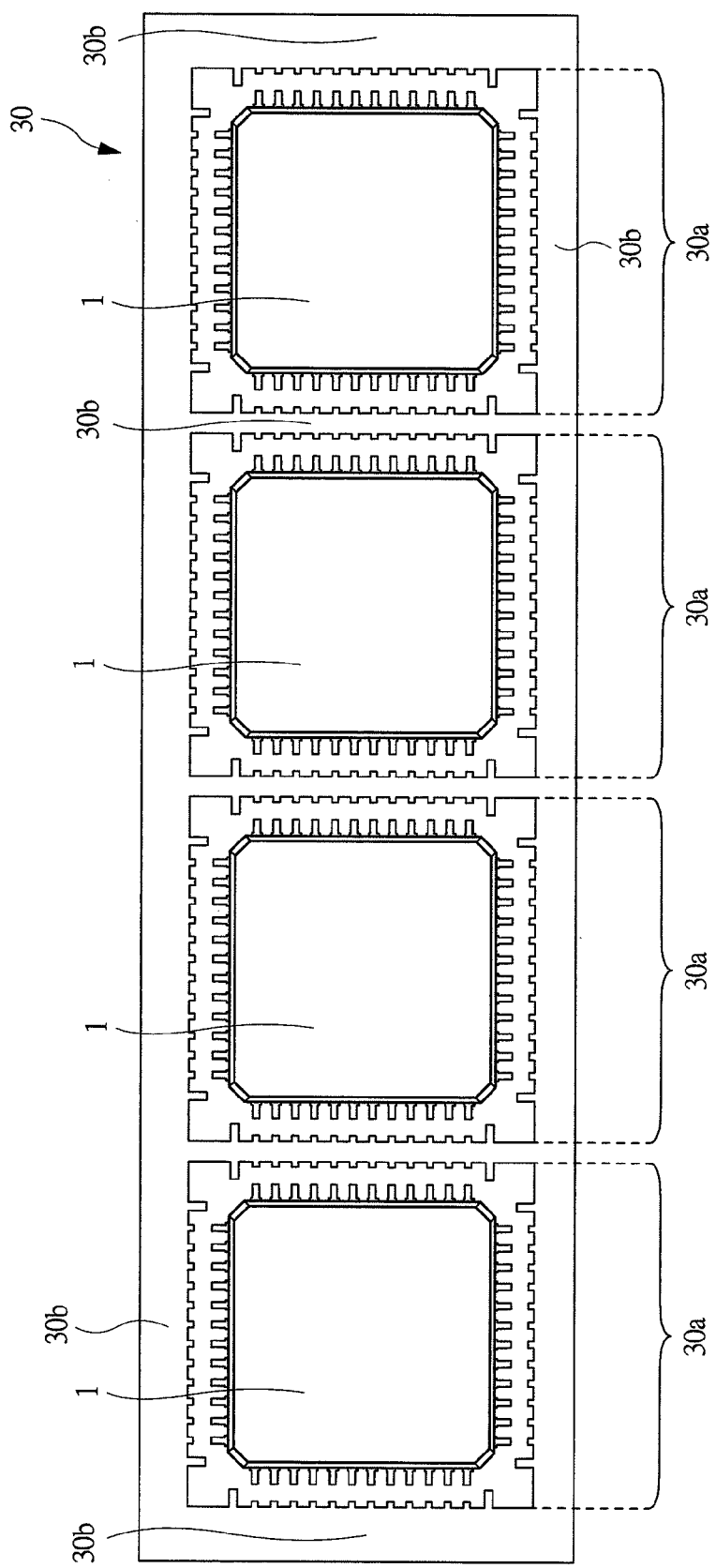
FIG. 23 is a plan view illustrating a state that a plurality of suspending leads are cut in a plurality of device regions of the lead frame to dice semiconductor devices.

10. Dicing Step;

FIG. 23 is a plan view illustrating a state that the plurality of suspending leads are cut in the plurality of device regions of the lead frame to dice the semiconductor devices.

Next, as a dicing step, the suspending leads 7 coupled to the frame portion 30b are cut as illustrated in FIG. 22 to dice them for each of the device regions 30a as illustrated in FIG. 23 to obtain the plurality of semiconductor devices 1. As means for cutting the suspending leads 7, as similarly to the above-described lead cutting step, the suspending leads 7 are cut by arranging a die (supporting member; whose illustration is omitted) and a punch (cutting blade; whose illustration is omitted) on the lower surface side of the lead frame 30 and the upper surface side thereof so that the leads are pressed, respectively.

Through each step as described above, the semiconductor device 1 illustrated in FIGS. 1 to 3 is completed.

Then, necessary examination and test such as visual inspection and electrical test are performed, and the semiconductor device is shipped or mounted on the mounting substrate 20 illustrated in FIG. 4.

Second Embodiment

In the above-described first embodiment, as an example of the semiconductor device, the semiconductor device in which one semiconductor chip is mounted on the die pad has been explained. In the present embodiment, a mode of an application case of a semiconductor device in which a plurality of semiconductor chips having different sizes from each other are mounted on one die pad will be explained. Note that, in the present embodiment, different points from the above-described embodiment will be mainly explained, and overlapped explanations thereof will be omitted.

Figure 24:
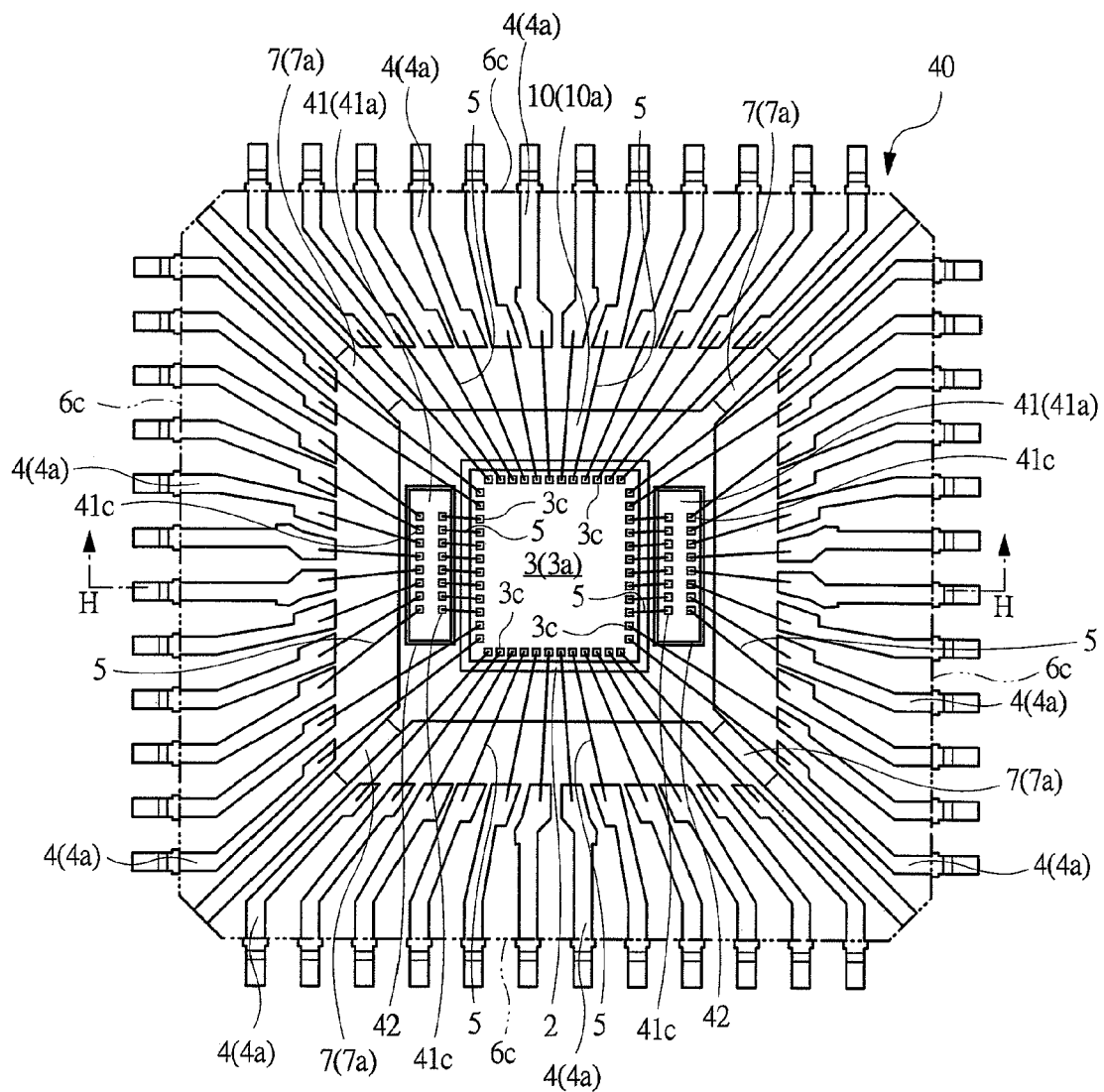
FIG. 24 is a plan view illustrating a semiconductor device which is a modification example of the semiconductor device illustrated in FIG. 5.
Figure 25:
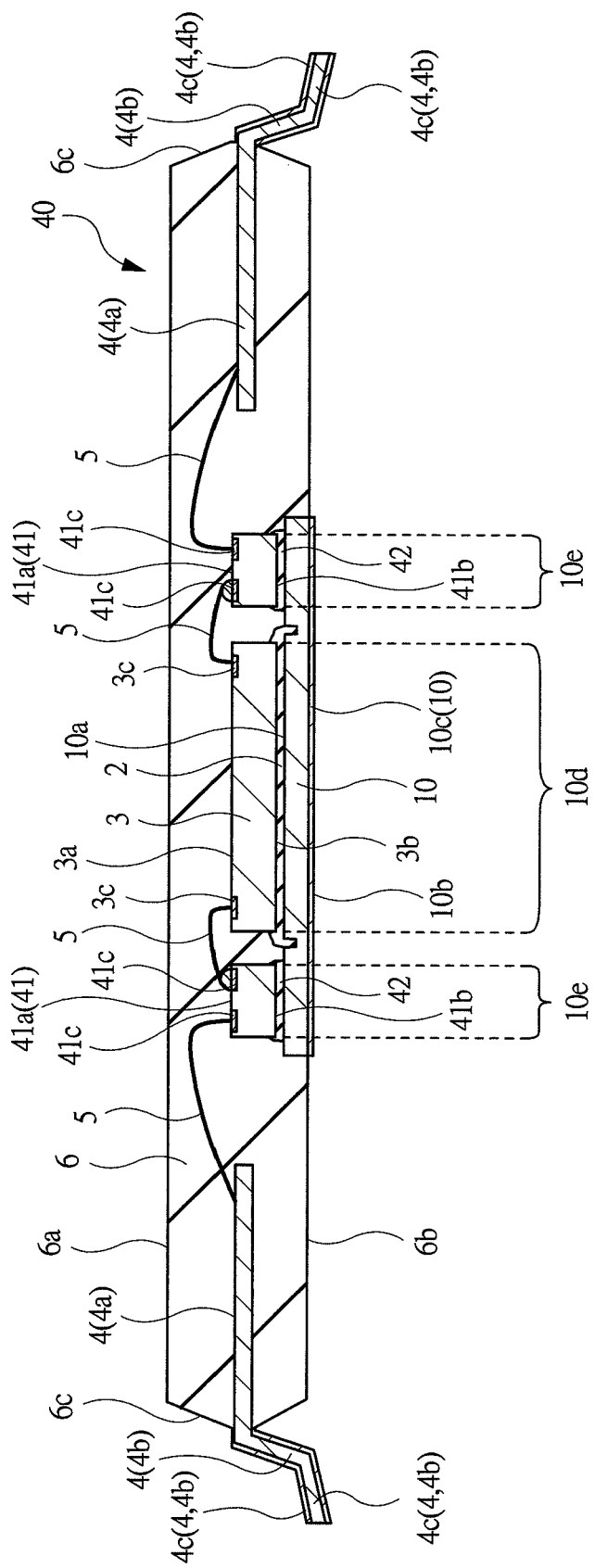
FIG. 25 is a cross-sectional view taken along a line H-H of FIG. 24.

FIG. 24 is a plan view illustrating a semiconductor device according to the present embodiment, which is a modification example of the semiconductor device illustrated in FIG. 5, and FIG. 25 is a cross-sectional view taken along a line H-H of FIG. 24. Also, FIG. 26 is an enlarged plan view illustrating a semiconductor device according to the present embodiment, which is a modification example of the semiconductor device illustrated in FIG. 7.

Figure 26:
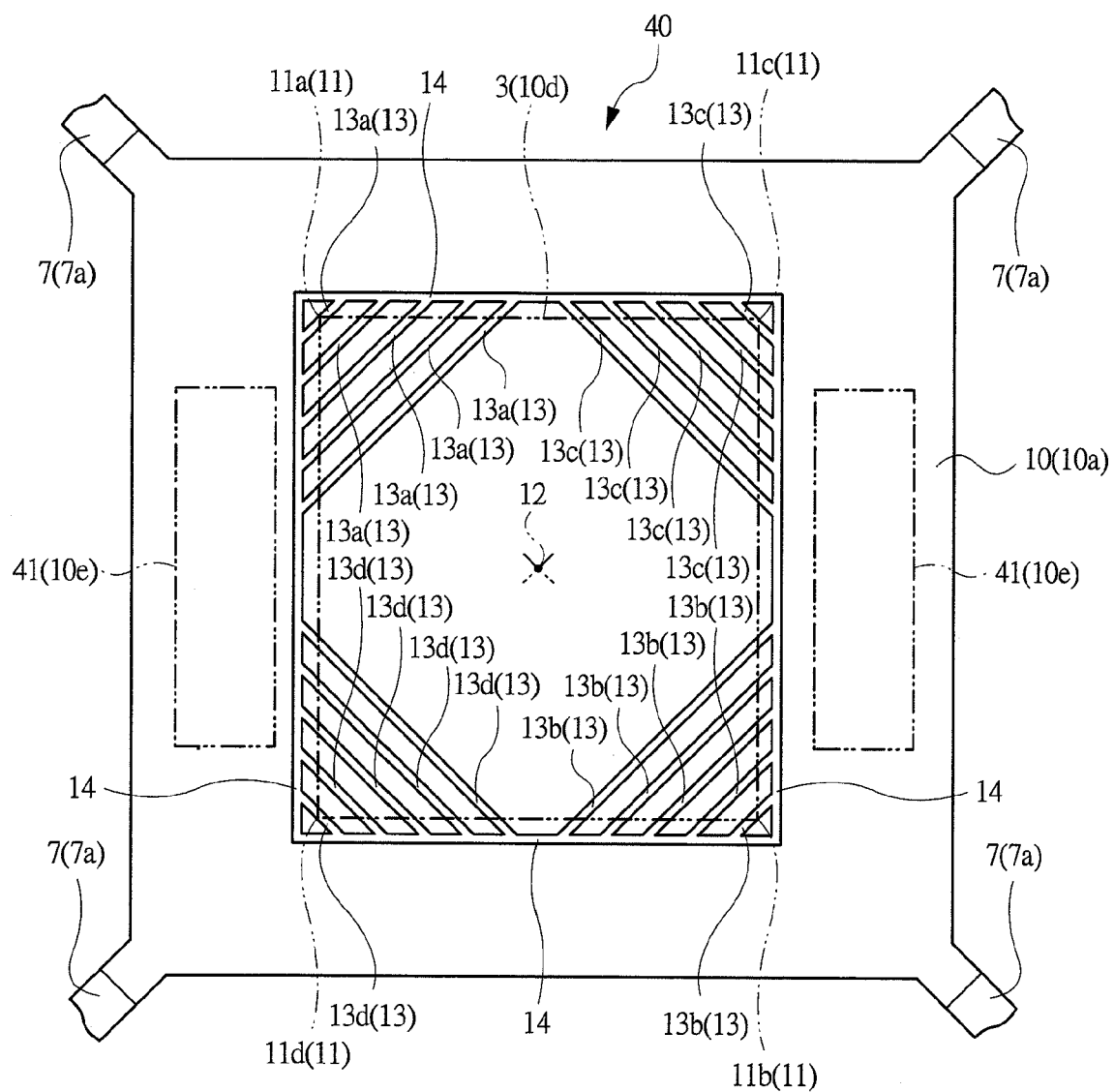
FIG. 26 is an enlarged plan view illustrating a semiconductor device which is the modification example of the semiconductor device illustrated in FIG. 7.

The different point between a semiconductor device 40 of the present embodiment illustrated in FIGS. 24 to 26 and the semiconductor device 1 explained in the above-described first embodiment is that the plurality of semiconductor chips are mounted on the die pad 10. That is, in the semiconductor device 40, the semiconductor chip 3 and a semiconductor chip 41 (for example, two semiconductor chips 41) are mounted on the die pad 10.

As an example of bonding the plurality of semiconductor chips in one package as described above, there is a semiconductor device of a SIP (System in Package) type. For example, in the present embodiment, a memory circuit which stores data such as a language or an image is formed in the semiconductor chips 41. That is, the semiconductor chips 41 are memory chips. On the other hand, a control circuit of controlling the memory circuit formed in the semiconductor chips 41 or others is formed in the semiconductor chip 3. And, this is a so-called SIP-type semiconductor device which configures a system by electrically connecting the semiconductor chips 3 and 41. The SIP-type semiconductor device has a merit that its mounting area can be smaller than that of a case of forming a control semiconductor device having a control circuit thereon and a memory semiconductor device having a memory circuit thereon so that they are in an independent package from each other.

The semiconductor chip 41 includes: an upper surface (main surface, front surface) 41a whose planar shape is quadrangular smaller than that of the upper surface 3a of the semiconductor chip 3; and a lower surface (rear surface) 41b (see FIG. 25) which is on an opposite side of the upper surface 41a. For example, in the present embodiment, each of the upper surface 41a and the lower surface 41b has a rectangular shape whose area is smaller than that of the upper surface 3a of the semiconductor chip 3 as illustrated in FIG. 24.

Also, a plurality of electrode pads (bonding pads) 41c are formed on the upper surface 41a of the semiconductor chip 41, and the plurality of electrode pads 41c are formed along long sides of the upper surface 41a in the present embodiment.

Further, although illustration is omitted, a semiconductor element (circuit element, memory circuit element in the present embodiment) is formed on the main surface of the semiconductor chip 41 (more specifically, a semiconductor-element formation region provided on the upper surface of the base material of the semiconductor chip 41), and the plurality of electrode pads 41c are electrically connected to the semiconductor element via a wiring (whose illustration is omitted) formed in a wiring layer arranged inside the semiconductor chip 41 (more specifically, between the upper surface 41a and the semiconductor-element formation region which is not illustrated).

Still further, the semiconductor chip 41 is mounted on a chip bonding region 10e of the die pad 10 so as to interpose a die-bond material 42 therebetween. More specifically, as illustrated in FIG. 25, the semiconductor chip 41 is mounted by a face-up mounting method in which the lower surface 41b is mounted so as to be opposed to the upper surface 10a of the die pad 10. Note that the die-bond material 42 is an adhesive material used for the die-bonding of the semiconductor chip 41 as similarly to the die-bond material 2 on which the semiconductor chip 3 is mounted, and, for example, a die-bond material obtained by containing metal particles made of silver (Ag) or others in an epoxy-based thermoset resin is used in the present embodiment.

Still further, as illustrated in FIG. 24, the plurality of leads 4 each made of, for example, copper (Cu) as the same as that of the die pad 10 are arranged in the periphery of the die pad 10. And, some of the plurality of electrode pads 41c formed on the upper surface 41a of the semiconductor chip 41 are electrically connected to the plurality of leads 4 (inner leads 4a) positioned inside the sealing resin 6 via a plurality of wires (conductive members) 5, respectively. Also, some of the plurality of electrode pads 3c of the semiconductor chip 3 are electrically connected to the plurality of leads 4 (inner leads 4a) positioned inside the sealing resin 6 via a plurality of wires (conductive members) 5, respectively. The other (s) of the plurality of electrode pads 3c of the semiconductor chip 3 are electrically connected to the other (s) of the plurality of electrode pads 41c of the semiconductor chip 41 via wires (conductive members) 5. That is, the semiconductor chip 3 and the semiconductor chips 41 are electrically connected to each other via the plurality of wires 5 and are electrically connected to the plurality of leads 4, which are external connection terminals of the semiconductor device 40, via the wires 5, respectively.

Here, as illustrated in FIG. 26, the trench portions 13 are formed in the chip bonding region 10d on which the semiconductor chip 3 of the semiconductor device 40 is mounted as similarly to those of the semiconductor device 1 explained in the above-described first embodiment. Note that a detailed structure, a preferred mode, and effects of each mode of the trench portions 13 are similar to those of the above-described first embodiment, and therefore, are omitted. On the other hand, no trench portion (trench) is formed in the chip bonding regions 10e on which the semiconductor chips 41 are mounted.

This is because an outer-shape size of the semiconductor chip 41 is smaller than an outer-shape size of the semiconductor chip 3. As explained in the above-described embodiment, according to the study made by the inventor of the present application, the peel-off of the die-bond material 2 can be prevented or suppressed by decreasing the value of the stress occurring at each of the corner portions 11 of the chip bonding region 10d. And, the value of the stress occurring at each of the corner portions 11 decreases as the decrease in the outer-shape size of the semiconductor chip 3, that is, the size of the chip bonding region 10d. For example, in the present embodiment, the outer-shape size of the semiconductor chip 41 (in other words, the size of the chip bonding region 10e) is equal to or smaller than the half of the outer-shape size of the semiconductor chip 3 (in other words, the size of the chip bonding region 10d). Therefore, since the size of the chip bonding region 10e is sufficiently small, the die-bond material 42 is not easily peeled off compared with the die-bond material 2. That is, in the present embodiment, in the case that the plurality of semiconductor chips 3 and 41 having the different outer-shape sizes from each other are mounted on the die pad 10, the trench portions 13 are formed in the chip bonding region 10d on which the semiconductor chip 3 is mounted, which is particularly easily peeled off. On the other hand, since the chip bonding regions 10e on which the semiconductor chips 41 are mounted have the sufficiently small outer-shape sizes, they are not easily peeled off, and therefore, the trench portions 13 are not formed therein.

Moreover, the trench portion 14 explained in the above-described embodiment is formed in the periphery of the chip bonding region 10d. On the other hand, the trench portion 14 is not formed in the periphery of each of the chip bonding regions 10e positioned adjacent to the chip bonding region 10d. This is because each planar size of the chip bonding regions 10e is smaller than that of the chip bonding region 10d, and therefore, it is easy to substantially uniformly spread the die-bond material 42 over the entire chip bonding regions 10e (whose center portion and each corner portion) without forming the trench portion 14 in the periphery of the chip bonding regions 10e.

Note that, as a modification example of the present embodiment, a mode that a plurality of semiconductor chips having substantially equal planar sizes to each other are mounted thereon is also conceivable. In this case, it is preferred to form the trench portions 13 in each of the chip bonding regions on which the semiconductor chips are mounted. Also, in this case, it is preferred to form the trench portion 14 in the periphery of each of the chip bonding regions.

Further, in a case of bonding a plurality of semiconductor chips having large and small different planar sizes from each other thereon, if the outer-shape size of the die pad is large, the trench portions 13 and 14 may be formed in not only a chip bonding region on which the semiconductor chip having the large outer-shape size is mounted but also a chip bonding region on which the semiconductor chip having the small outer-shape size is mounted as described above. In this manner, while the outer-shape size of the die pad 10 to be used is larger than that of the die pad (see FIG. 26) on which the trench portions 13 and 14 are formed in only the chip bonding region on which the semiconductor chip having the large outer-shape size is mounted, the peel-off of the semiconductor chip having the small outer-shape size can be more reliably suppressed, and therefore, the reliability of the semiconductor device can be improved.

In the foregoing, the invention made by the present inventor has been concretely described based on the embodiments. However, it is needless to say that the present invention is not limited to the foregoing embodiments and various modifications and alterations can be made within the scope of the present invention.

For example, in the above-described first and second embodiments, the semiconductor device of the die-pad exposing type (tab exposing type) in which the lower surface 10b of the die pad 10 is exposed from the sealing resin 6 at the lower surface 6b of the sealing resin 6 has been explained. However, as a semiconductor device 45 illustrated in FIG. 27 which is a modification example of FIG. 6, the invention can be also applied to a semiconductor device of a die-pad embedding type (tab embedding type) in which the lower surface 10b of the die pad 10 is not exposed from the sealing resin 6 but is sealed with the sealing resin 6.

Figure 27:
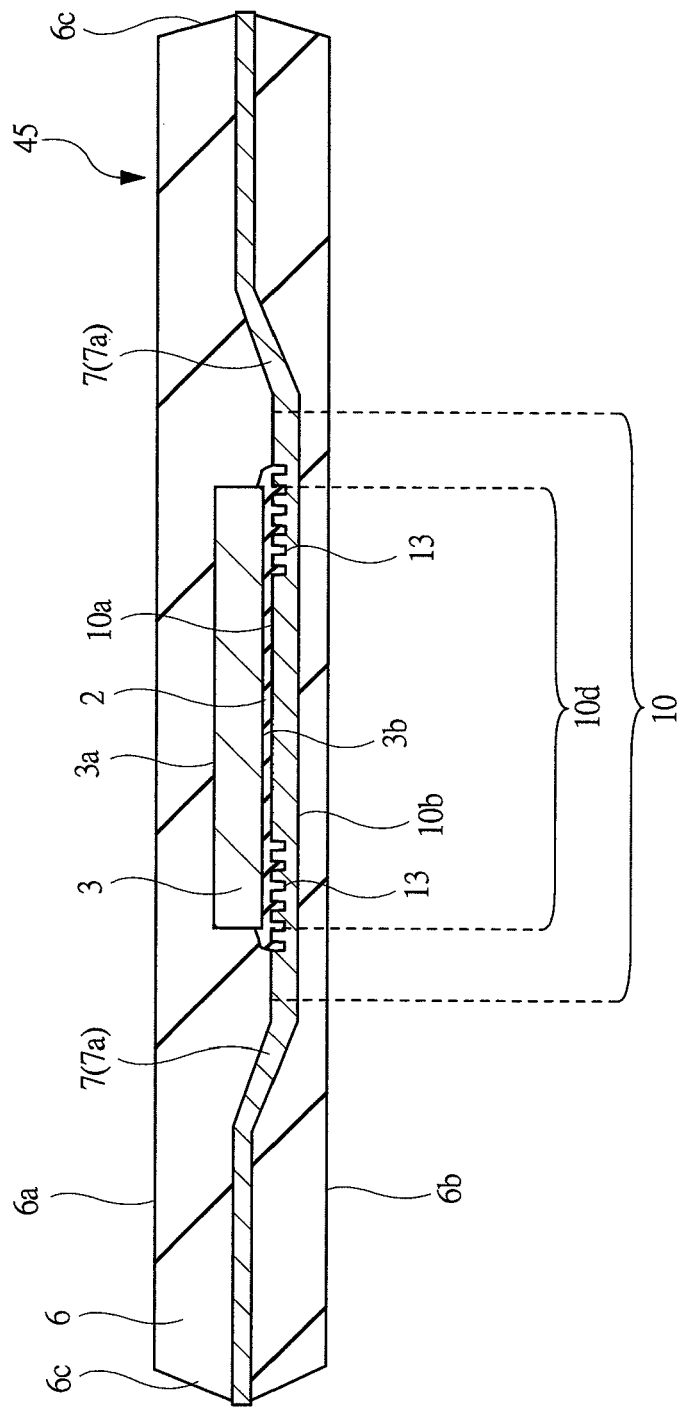
FIG. 27 is a cross-sectional view illustrating a semiconductor device which is the modification example of the semiconductor device illustrated in FIG. 6.

When the semiconductor device 45 illustrated in FIG. 27 is compared with the semiconductor device 1 illustrated in FIG. 6, the die pad 10 is sealed with the sealing resin 6, and therefore, the amount of the moisture entering from outside is small. However, as explained in the above-described first embodiment, there are the cases such that the moisture remains inside the sealing resin 6 or that the moisture enters from the interface between the lead 4 and the sealing resin 6, and, if the die-bond material 2 is peeled off, the moisture remains inside the space formed by the peel-off, and the remaining is a cause of corrosion of the die pad 10 or others. Therefore, by forming the trench portion (trench) 13 explained in the above-described first embodiment in the chip bonding region 10d, the peel-off or the expansion of the peel-off can be suppressed, so that the reduction in the reliability due to the corrosion of the die pad 10 can be suppressed.

Also, for example, in the above-described first and second embodiments, the semiconductor device of the QFP type is taken and explained as the package example of the semiconductor device. However, the package mode is not limited to the QFP. For example, the invention can be applied to, for example, QFN (Quad Flat Non-Leaded Package) in which a plurality of external terminals are exposed from a lower surface and a lateral surface of a sealing resin, SOP (Small Outline Package) or SON (Small Outline Non-Leaded Package) in which a sealing resin has a rectangular planar shape and an external terminal is exposed from a long side thereof, and others.

INDUSTRIAL APPLICABILITY

The present invention can be widely utilized in the manufacturing industry of manufacturing a semiconductor device.

SYMBOL EXPLANATION 1 semiconductor device
2 die-bond material (adhesive material)
2a bonding paste (adhesive material)
3 semiconductor chip
3a upper surface (main surface, front surface)
3b lower surface (main surface, rear surface)
3c electrode pad (bonding pad)
4 lead
4a inner lead
4b outer lead
4c exterior plating film
5 wire (conductive member)
6 sealing resin (sealing body)
6a upper surface
6b lower surface
6c side surface
7 suspending lead
7a tilted portion
8 tie bar (dam bar)
10 die pad (chip bonding portion)
10a upper surface (chip bonding surface)
10b lower surface
10c exterior plating film
10d chip bonding region
10e chip bonding region
11 corner portion
11a first corner portion
11b second corner portion
11c third corner portion
11d fourth corner portion
12 center portion
13 trench portion (trench)
13a first trench
13b second trench
13c third trench
13d fourth trench
14 trench portion (trench)
20 mounting substrate
22 solder material (joint material)
23 terminal
30 lead frame
30a device region
30b frame portion
35 molding die
36 upper die
36a die surface
36b cavity
37 lower die
37a die surface
37b cavity
40 semiconductor device
41 semiconductor chip
41a upper surface (main surface, front surface)
41b lower surface (main surface, rear surface)
41c electrode pad (bonding pad)
42 die bond material (adhesive material)
45 semiconductor device
100 semiconductor device
101 die pad
102 center portion
103 die pad
104 trench portion
105 non-trench portion

The invention claimed is:
1. A semiconductor device comprising: a die pad; a semiconductor chip; a plurality of leads; a plurality of conductive members; and a sealing body,
the die pad including:
an upper surface having a quadrangular shape in plan view;

a chip bonding region having a quadrangular shape in plan view and being provided on the upper surface;

a first groove being formed at a first corner portion of the chip bonding region;

a second groove being formed at a second corner portion opposed to the first corner portion so as to interpose a center portion where two diagonal lines of the chip bonding region intersect with each other in a plan view;

a third groove being formed at a third corner portion of the chip bonding region;

a fourth groove being formed at a fourth corner portion opposed to the third corner portion so as to interpose the center portion of the chip bonding region in plan view; and a lower surface on an opposite side from the upper surface, the semiconductor chip including:

a first main surface having a quadrangular shape in plan view;

a plurality of electrode pads formed on the first main surface; and a second main surface on an opposite side from the first main surface, the semiconductor chip having an outer-shape size smaller than an outer-shape size of the die pad in plan view and being mounted on the chip bonding region of the die pad so as to interpose a die-bond material;

the plurality of leads being arranged along a periphery of the die pad;

the plurality of conductive members electrically connecting the plurality of electrode pads of the semiconductor chip with the plurality of leads, respectively;

the sealing body sealing the semiconductor chip, the plurality of conductive members, and the die pad, each of the first groove and the second groove being formed along a first direction intersecting with a first diagonal line which connects between the first corner portion and the second corner portion of the chip bonding region in plan view, each of the third groove and the fourth groove being formed along a second direction intersecting with a second diagonal line of the chip bonding region which intersects with the first diagonal line in plan view, each of the first groove, the second groove, the third groove, and the fourth groove being formed in a region overlapped with the semiconductor chip and in a region not overlapped with the semiconductor chip in plan view, each of the first groove, the second groove, the third groove, and the fourth groove being formed shallower than a thickness of the die pad, the semiconductor chip having a linear expansion coefficient different from a linear expansion coefficient of the die pad, and the die-bond material being arranged at the center portion, the first corner portion, the second corner portion, the third corner portion, and the fourth corner portion of the chip bonding region.

2. The semiconductor device according to claim 1, comprising:

a first plurality of rows of grooves including the first groove, the first plurality of rows being arranged from the first corner portion of the chip bonding region toward the center portion of the chip bonding region, a second plurality of rows of grooves including the second groove, the second plurality of rows being arranged from the second corner portion of the chip bonding region toward the center portion of the chip bonding region, a third plurality of rows of grooves including the third groove, the third plurality of rows being arranged from the third corner portion of the chip bonding region toward the center portion of the chip bonding region, and a fourth plurality of rows of grooves including the fourth groove, the fourth plurality of rows being arranged from the fourth corner portion of the chip bonding region toward the center portion of the chip bonding region, wherein each groove of the first to fourth pluralities of rows of grooves is formed shallower than the thickness of the die pad and is formed in a region overlapped with the semiconductor chip and in a region not overlapped with the semiconductor chip in plan view.

3. The semiconductor device according to claim 2, wherein each of the first, the second, the third, and the fourth pluralities of rows of grooves is not formed at the center portion of the chip bonding region.

4. The semiconductor device according to claim 3, wherein the first plurality of rows of grooves, the second plurality of rows of grooves, the third plurality of rows of grooves, and the fourth plurality of rows of grooves are arranged so as not to intersect with each other inside the chip bonding region.

5. The semiconductor device according to claim 2, wherein, in the upper surface of the die pad, a fifth groove having an annular shape in plan view extends along each side of the chip bonding region outside the chip bonding region.

6. The semiconductor device according to claim 5, wherein each groove of the first, the second, the third, and the fourth pluralities of rows of grooves is coupled at opposite ends to the fifth groove.

7. The semiconductor device according to claim 2, wherein the lower surface of the die pad is exposed from the sealing body.

8. A semiconductor device comprising: a die pad; a first semiconductor chip; a second semiconductor chip; a plurality of leads; a plurality of conductive members; and a sealing body, the die pad including:

an upper surface having a quadrangular shape in plan view;

a first chip bonding region having a quadrangular shape in plan view provided on the upper surface;

a second chip bonding region having a quadrangular shape in plan view smaller the first chip bonding region provided adjacent to the first chip bonding region on the upper surface;

a first groove being formed at a first corner portion of the first chip bonding region;

a second groove being formed at a second corner portion opposed to the first corner portion so as to interpose a first center portion where two diagonal lines of the first chip bonding region intersect with each other in plan view;

a third groove being formed at a third corner portion of the first chip bonding region;

a fourth groove being formed at a fourth corner portion opposed to the third corner portion so as to interpose the first center portion of the first chip bonding region in plan view;

a fifth corner portion of the second chip bonding region;

a sixth corner portion being opposed to the fifth corner portion so as to interpose a second center portion where two diagonal lines of the second chip bonding
region intersect with each other in plan view;
a seventh corner portion of the second chip bonding
region;
an eighth corner portion being opposed to the seventh
corner portion so as to interpose the second center
portion of the second chip bonding region in plan
view; and
a lower surface on an opposite side from the upper
surface,
the first semiconductor chip including:
a first main surface having a quadrangular shape in plan
view;
a plurality of first electrode pads being formed on the
first main surface; and
a second main surface on an opposite side from the first
main surface,
the first semiconductor chip having an outer-shape size
smaller than an outer-shape size of the die pad in plan
view and being mounted on the first chip bonding region
of the die pad so as to interpose a first die-bond material;
the second semiconductor chip including:
a third main surface having a quadrangular shape in plan
view smaller than the first main surface of the first
semiconductor chip;
a plurality of second electrode pads being formed on the
third main surface; and
a fourth main surface on an opposite side from the third
main surface,
the second semiconductor chip being mounted on the second chip bonding region of the die pad so as to interpose
a second die-bond material;
the plurality of leads being arranged along periphery of the
die pad;
the plurality of conductive members electrically connecting the plurality of first electrode pads of the first semiconductor chip and the plurality of second electrode
pads of the second semiconductor chip with the plurality
of leads, respectively; and
the sealing body sealing the first semiconductor chip, the
second semiconductor chip, the plurality of conductive
members, and the die pad,
each of the first groove and the second groove being formed
along a first direction intersecting with a first diagonal
line which connects between the first corner portion and
the second corner portion of the first chip bonding region
in plan view,
each of the third groove and the fourth groove being formed
along a second direction intersecting with a second
diagonal line of the first chip bonding region which
intersects with the first diagonal line in plan view,
each of the first groove, the second groove, the third
groove, and the fourth groove being formed in a region
overlapped with the first semiconductor chip and in a
region not overlapped with the first semiconductor chip
in plan view,
each of the first groove, the second groove, the third
groove, and the fourth groove being formed shallower
than a thickness of the die pad,
the first semiconductor chip having a linear expansion
coefficient different from a linear expansion coefficient
of the die pad,
the first die-bond material being arranged at the first center
portion, the first corner portion, the second corner portion, the third corner portion, and the fourth corner portion of the first chip bonding region, and
the second die-bond material being arranged at the second
center portion, the fifth corner portion, the sixth corner
portion, the seventh corner portion, and the eighth corner
portion of the second chip bonding region.

9. The semiconductor device according to claim 8, wherein
no groove is formed inside the second chip bonding region.

10. The semiconductor device according to claim 9, comprising:
a first plurality of rows of grooves including the first
groove, the first plurality of rows being arranged from
the first corner portion of the first chip bonding region
toward the center portion of the first chip bonding
region,
a second plurality of rows of grooves including the second
groove, the second plurality of rows being arranged from
the second corner portion of the first chip bonding region
toward the center portion of the first chip bonding
region,
a third plurality of rows of grooves including the third
groove, the third plurality of rows being arranged from
the third corner portion of the first chip bonding region
toward the center portion of the first chip bonding
region, and
a fourth plurality of rows of grooves including the fourth
groove, the fourth plurality of rows being arranged from
the fourth corner portion of the first chip bonding region
toward the center portion of the first chip bonding
region,
wherein each groove of the first to fourth pluralities of rows
of grooves is formed shallower than the thickness of the
die pad and is formed in a region overlapped with the
semiconductor chip and in a region not overlapped with
the semiconductor chip in plan view.

11. A semiconductor device comprising:
a die pad; and
a semiconductor chip mounted to the die pad by a die-bond
material;
wherein the die pad includes:
an upper surface;
a lower surface;
a quadrangular chip bonding region on the upper surface
having four corners formed by adjacent sides of the
chip bonding region; and
four sets of one or more rows of grooves disposed on the
chip bonding region, in correspondence with the four
corners, respectively,
wherein each groove has a bottom disposed between
the upper and lower surfaces of the die pad,
wherein each groove has an intermediate portion disposed beneath the semiconductor chip and two end
portions respectively extending outwardly beyond
the semiconductor chip from the adjacent sides
forming the corresponding corners in plan view.

12. The semiconductor device of claim 11, wherein the sets
of grooves corresponding to opposite corners of the chip
bonding region are parallel to each other, and wherein none of
the grooves of the four sets of grooves intersect each other.

13. The semiconductor device of claim 12, wherein the
upper surface of the die pad has an additional groove that
extends around the outside of the semiconductor chip in plan
view so as to intersect each groove of the four sets of grooves.

* * * * *